(12) United States Patent
Sirinorakul

(10) Patent No.: US 9,355,940 B1
(45) Date of Patent: May 31, 2016

(54) AUXILIARY LEADFRAME MEMBER FOR STABILIZING THE BOND WIRE PROCESS

(71) Applicant: UTAC Thai Limited, Bangkok (TH)

(72) Inventor: Saravuth Sirinorakul, Bangkok (TH)

(73) Assignee: UTAC THAI LIMITED, Bangkok (TH)

( * ) Notice: Subject to any disclaimer, the term of this patent is extended or adjusted under 35 U.S.C. 154(b) by 2 days.

(21) Appl. No.: 13/710,152

(22) Filed: Dec. 10, 2012

Related U.S. Application Data

(63) Continuation-in-part of application No. 12/960,268, filed on Dec. 3, 2010, now Pat. No. 8,368,189.

(60) Provisional application No. 61/576,330, filed on Dec. 15, 2011, provisional application No. 61/266,819, filed on Dec. 4, 2009.

(51) Int. Cl.
*H01L 23/495* (2006.01)
*H01L 21/56* (2006.01)

(52) U.S. Cl.
CPC .............. *H01L 23/495* (2013.01); *H01L 21/56* (2013.01)

(58) Field of Classification Search
None
See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,285,104 A * | 2/1994 | Kondo et al. ................. 257/666 |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,708,295 A * | 1/1998 | Oga et al. ...................... 257/676 |
| 5,767,527 A * | 6/1998 | Yoneda et al. .................. 257/48 |
| 5,843,808 A | 12/1998 | Karnezos |
| 5,872,394 A * | 2/1999 | Shinohara et al. ............ 257/666 |
| 5,959,363 A | 9/1999 | Yamada et al. |
| 5,990,692 A | 11/1999 | Jeong et al. |
| 6,072,239 A | 6/2000 | Yoneda et al. |
| 6,111,324 A | 8/2000 | Sheppard et al. |
| 6,159,770 A | 12/2000 | Tetaka et al. |
| 6,197,615 B1 | 3/2001 | Song et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,250,841 B1 | 6/2001 | Ledingham |
| 6,258,629 B1 * | 7/2001 | Niones et al. ................. 438/111 |
| 6,284,569 B1 | 9/2001 | Sheppard et al. |
| 6,285,075 B1 | 9/2001 | Combs et al. |

(Continued)

OTHER PUBLICATIONS

Michael Quirk and Julian Serda, Semiconductor Manufacturing Technology, Pearson Education International, Pearson Prentice Hall, 2001, pp. 587-588.

(Continued)

*Primary Examiner* — Daniel Luke
(74) *Attorney, Agent, or Firm* — Haverstock & Owens LLP

(57) ABSTRACT

A semiconductor package comprises a die attach pad and an auxiliary support member at least partially circumscribing the die attach pad. A set of contact leads is formed extending outward from the die attach pad. A first set of contact pads is formed on the bottom surface of the distal ends of the contact leads. An optional second set of contact pads is formed at the bottom surface of the proximal end. The auxiliary support member prevents damage to the contact leads and prevents the leads from bending during the manufacturing process.

22 Claims, 26 Drawing Sheets

(56) References Cited

U.S. PATENT DOCUMENTS

| | | |
|---|---|---|
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,372,625 B1 | 4/2002 | Shigeno et al. |
| 6,376,921 B1 | 4/2002 | Yoneda et al. |
| 6,384,472 B1 | 5/2002 | Huang |
| 6,392,427 B1 | 5/2002 | Yang |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,476,469 B2 | 11/2002 | Hung et al. |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,798,046 B1 * | 9/2004 | Miks .................. 257/666 |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,894,376 B1 | 5/2005 | Mostafazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,126,218 B1 | 10/2006 | Darveaux et al. |
| 7,205,178 B2 | 4/2007 | Shiu et al. |
| 7,224,048 B1 | 5/2007 | McLellan et al. |
| 7,247,526 B1 | 7/2007 | Fan et al. |
| 7,259,678 B2 | 8/2007 | Brown et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,482,690 B1 | 1/2009 | Fan et al. |
| 7,495,319 B2 | 2/2009 | Fukuda et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 2001/0005047 A1 | 6/2001 | Jimarez et al. |
| 2001/0007285 A1 | 7/2001 | Yamada et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0071345 A1 * | 4/2003 | Corisis ................. 257/692 |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077598 A1 * | 4/2005 | Goh et al. .............. 257/666 |
| 2005/0077613 A1 | 4/2005 | McLellan et al. |
| 2005/0236701 A1 | 10/2005 | Minamio et al. |
| 2005/0263864 A1 | 12/2005 | Islam et al. |
| 2006/0022316 A1 * | 2/2006 | Huang et al. ............ 257/676 |
| 2006/0035414 A1 * | 2/2006 | Park et al. .............. 438/124 |
| 2006/0071351 A1 | 4/2006 | Lange |
| 2006/0170081 A1 | 8/2006 | Gerber et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0237231 A1 | 10/2006 | Hata et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0093000 A1 | 4/2007 | Shim et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2009/0014848 A1 | 1/2009 | Ong Wai Lian et al. |
| 2009/0014854 A1 * | 1/2009 | Cho et al. ............... 257/676 |
| 2009/0152694 A1 | 6/2009 | Bemmert et al. |
| 2009/0230525 A1 | 9/2009 | Chang Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2011/0115061 A1 | 5/2011 | Krishnan et al. |
| 2011/0201159 A1 | 8/2011 | Mori et al. |
| 2013/0069221 A1 | 3/2013 | Lee et al. |

OTHER PUBLICATIONS

Office Action mailed on Nov. 2, 2015, U.S. Appl. No. 12/834,688, filed Jul. 12, 2010, Saravuth Sirinorakul, 17 pages.

* cited by examiner

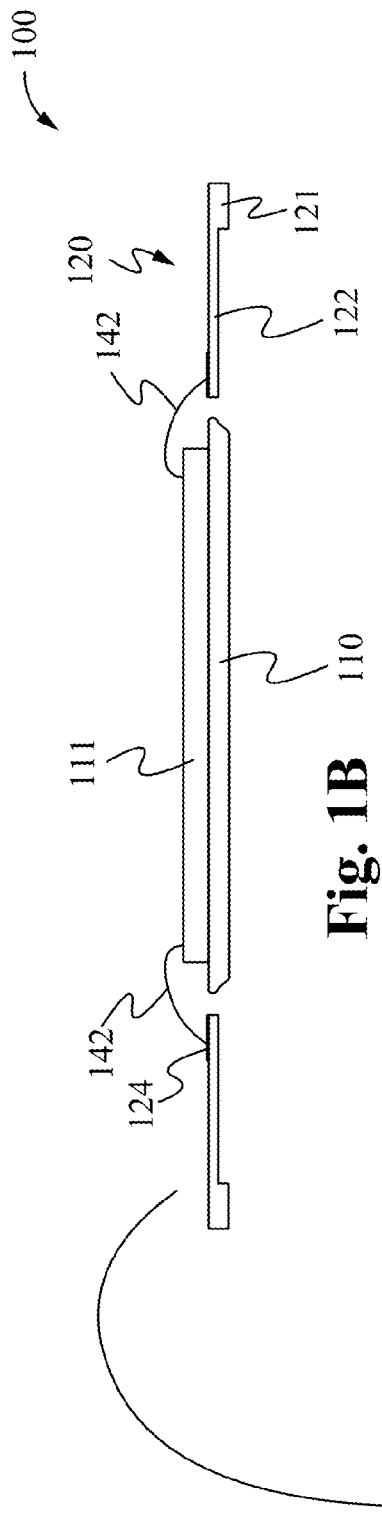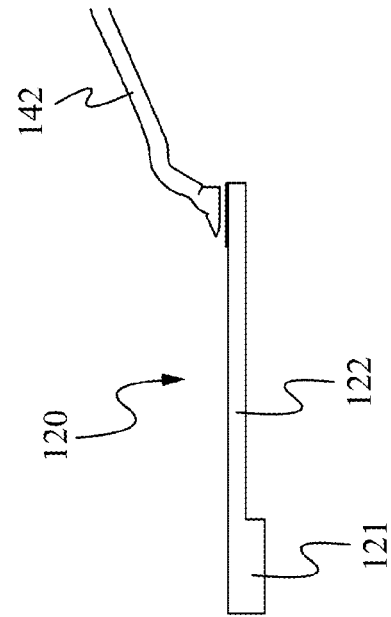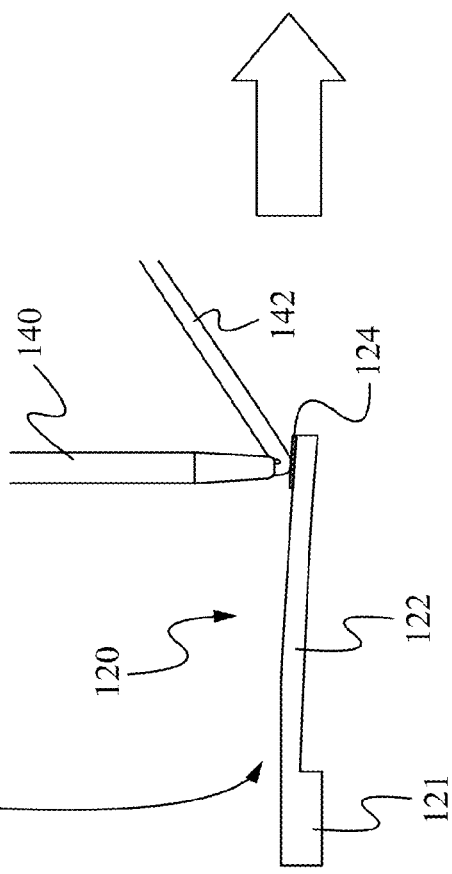
Fig. 1B
Fig. 1C
Fig. 1D

AUXILIARY LEADFRAME MEMBER FOR STABILIZING THE BOND WIRE PROCESS

RELATED APPLICATIONS

This application claims benefit of priority under 35 U.S.C. section 119(e) of the U.S. Provisional Patent Application Ser. No. 61/576,330 filed Dec. 15, 2011, entitled "AUXILIARY LEADFRAME PORTION FOR STABILIZING WIRE BOND AND AVOIDING BEND LEAD DURING HANDLING," and is a Continuation-In-Part Application of Co-Pending U.S. patent application Ser. No. 12/960,268, filed Dec. 3, 2010 and titled "AUXILIARY LEADFRAME MEMBER FOR STABILIZING THE BOND WIRE PROCESS," which in turn claims benefit of priority under 35 U.S.C. section 119(e) of the then U.S. Provisional Patent Application Ser. No. 61/266,819 filed Dec. 4, 2009, entitled "AUXILIARY LEADFRAME PORTION FOR STABILIZING WIRE BOND AND AVOIDING BEND LEAD DURING HANDLING," all of which are hereby incorporated by reference in their entirety.

FIELD OF THE INVENTION

The present invention is related to the field of semiconductor device manufacturing. More specifically, the present invention relates to leadframes for stabilizing wire bond placement and avoiding bent leads.

BACKGROUND

In general, multiterminal integrated circuit (IC) packages are formed from a copper leadframe. FIG. 1A shows such a prior art process. A bare copper leadframe 100 shown in a top view and a bottom view is partially etched to pattern the contact leads 120 and the die attach pad 110. The partial etching is able to be done in any number of ways known by the person of ordinary skill. The contact leads 120 are generally etched to a partial thickness portion 122 and a full thickness portion 121. As used herein, the term "full thickness" generally denotes a member or structure being the same thickness as the original monolithic metal substrate from which the structure is etched. "Partial thickness" generally denotes that the structure has been etched to a partially, so the thickness is some fraction of the thickness of the original substrate. The full thickness portion 121 is such that the bottom surface 123 is exposed when the leadframe 100 is eventually encased in a mold compound. The exposed area of the full thickness portion 121 is soldered into application, such as a PC board having several traces and contact pads for forming an electrical connection with a semiconductor die (not shown) housed within the IC package. The partial thickness portion 122 extends away from the die attach pad 110. A plated portion 124 at the end of the contact lead 120 closest to the die attach pad 110, or the proximal end, receives a wire bond (not shown) for forming an electrical connection with a semiconductor die. As a result, an electrical connection is formed between the semiconductor die and the bottom surface 123 of the contact lead 120.

FIG. 1B shows a cross section of the copper leadframe 100 and the contact leads 120. A semiconductor die 111 is mounted on a top surface of the die attach pad 110. Bond wires 142 are mounted from the semiconductor die 111 to the partial thickness portion 122 of the contact lead 120. However, as shown in FIG. 1C, because of the flexible nature of most metals including copper, the partial thickness portion 122 bends when a capillary 140 attempts to place the bond wire 142 onto the plated end 124. Therefore, as shown in FIG. 1D, the partial thickness portion 122 rebounds and may cause the bond wire 142 to lift before a proper weld can be established. As a result, the entire device is generally scrapped, as the time-cost of repair can outweigh the cost of a new unit. Furthermore, as shown in FIG. 1E, the partial thickness portions 122' can easily become bent or destroyed due to improper handling. Again, the leadframe 100 with the bent contact leads 120' is scrapped. Such scrap adversely affects manufacturing yield. It is well known that the semiconductor industry is highly cost driven, and any phenomenon that causes lower than optimum yield causes manufacturing costs to increase. To that end, it is highly desirable to optimize manufacturing yield.

SUMMARY OF THE DISCLOSURE

What is provided is a leadframe substrate having contact leads and an auxiliary support member for preventing bending of the contact leads during handing and manufacturing. Preferably, the auxiliary support member is integrally formed with the leadframe in an etching process. The auxiliary support member provides support for the contact leads to prevent bending of the leads during a manufacturing step and also prevents damage to the contact leads during handling. The auxiliary support member is removed by a later processing step when no longer needed, thereby electrically isolating all of the contact leads with respect to each other. As a result, a more robust bond wire connection can be made without damaging the contact leads. As a result, yield is improved with respect to contact leads that are bent or destroyed during handling and manufacturing.

In a first aspect of the invention, a semiconductor package comprises a die attach pad and at least one semiconductor die coupled with the die attach pad. In some embodiments, a groove at least partially circumscribes the die attach pad. Preferably, the package further comprises a set of contact leads extending outwards from the die attach pad and positioned above the groove, each contact lead having a proximal end and a distal end and a plurality of bond wires for electrically coupling the die to at least one contact pad. The groove is formed by the removal of the auxiliary support thereby electrically isolating the contact leads. In some embodiments, each contact lead comprises a full thickness portion at the distal end and a partial thickness portion at the proximal end. Alternatively, the removal of the auxiliary support member forms full thickness portions at the proximal ends of the contact leads such that each contact lead comprises a contact pad on the bottom surface of the proximal end. In some embodiments, the groove is filled by an epoxy filler.

In another aspect of the invention, a method of making a semiconductor package comprises etching a through pattern in a metal substrate, thereby forming a die attach pad, a set of contact leads having a first set of contact pads surrounding the die attach pad and an auxiliary support member substantially circumscribing the die attach pad. Then, at least one semiconductor die is mounted on the die attach pad. Then, bond wires are placed electrically coupling the semiconductor die to the contact leads and contact pads. Then, the leadframe, bond wires and semiconductor die are at least partially encased in a mold compound, and the auxiliary support member is etched away, electrically isolating the contact leads. In some embodiments, forming a set of contact leads comprises forming a full thickness portion at the distal end and forming a partial thickness portion at the proximal end. Also, etching away at least a portion of the auxiliary support member can form a second set of contact pads.

In another aspect of the invention, a leadframe for supporting a semiconductor die, comprises a plurality of die attach pads arranged in a matrix, a set of contact leads, each contact lead having a proximal end and a distal end, an auxiliary support member at least partially circumscribing each of the die attach pads, wherein each set of contact leads is positioned above the auxiliary support member. As described above, the auxiliary support member effectuates a more robust manufacturing process. The auxiliary support member prevents the contact leads from being bent during handling or during the bond wiring process. In some embodiments, each contact lead comprises a contact pad on a bottom surface of the distal end and a contact pad on a bottom surface of the proximal end. Also, each contact lead comprises a full thickness portion at the distal end. In some embodiments, each contact lead comprises a partial thickness portion at the proximal end.

BRIEF DESCRIPTION OF THE DRAWINGS

The novel features of the invention are set forth in the appended claims. However, for purpose of explanation, several embodiments of the invention are set forth in the following figures.

FIG. 1B shows a prior art leadframe in cross section.

FIG. 1C shows a prior art leadframe in a manufacturing step.

FIG. 1D shows a prior art leadframe in a manufacturing step.

DETAILED DESCRIPTION

Reference will now be made in detail to the embodiments of the leadframe method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
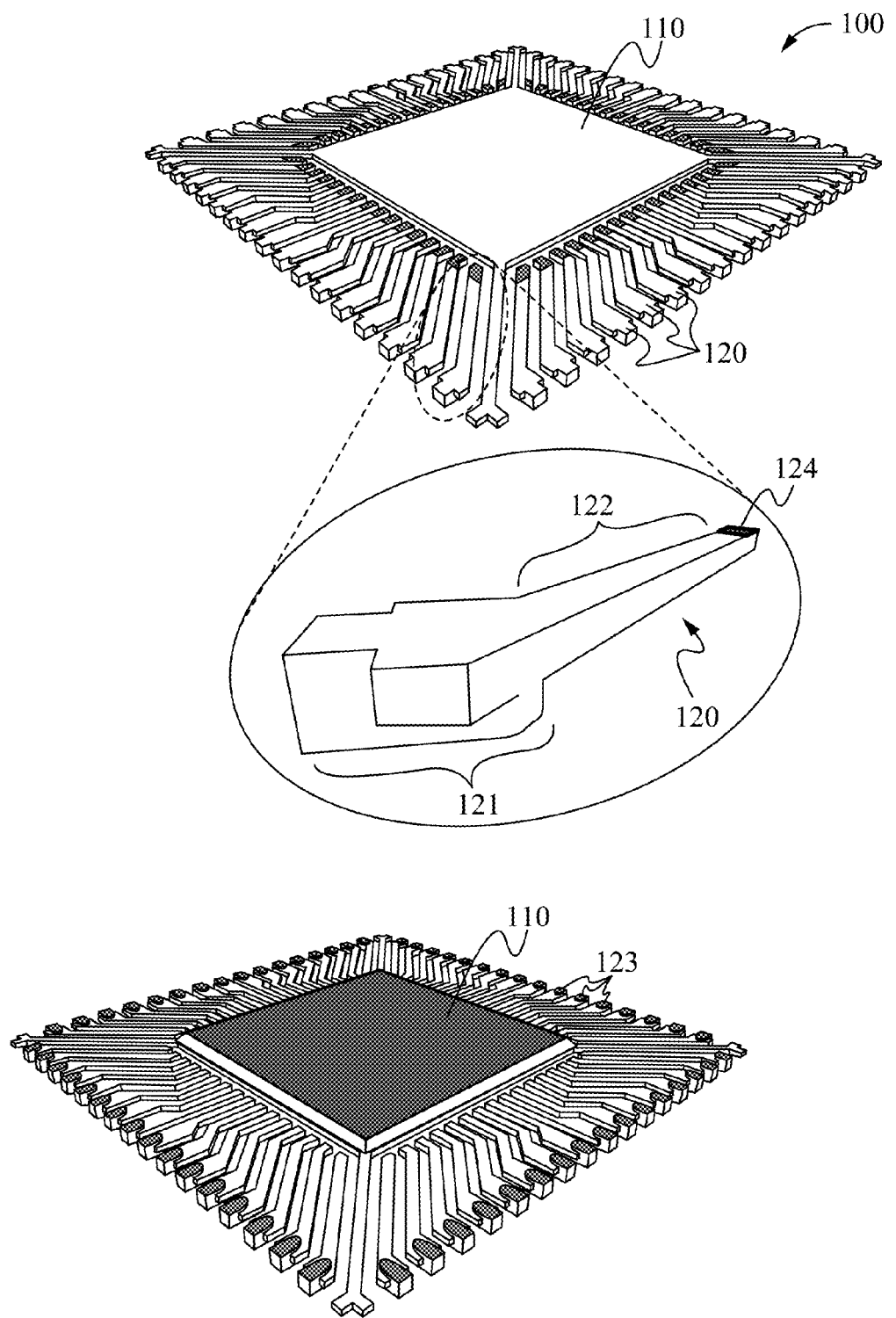
FIG. 1A shows a prior art leadframe.
Figure 1E:
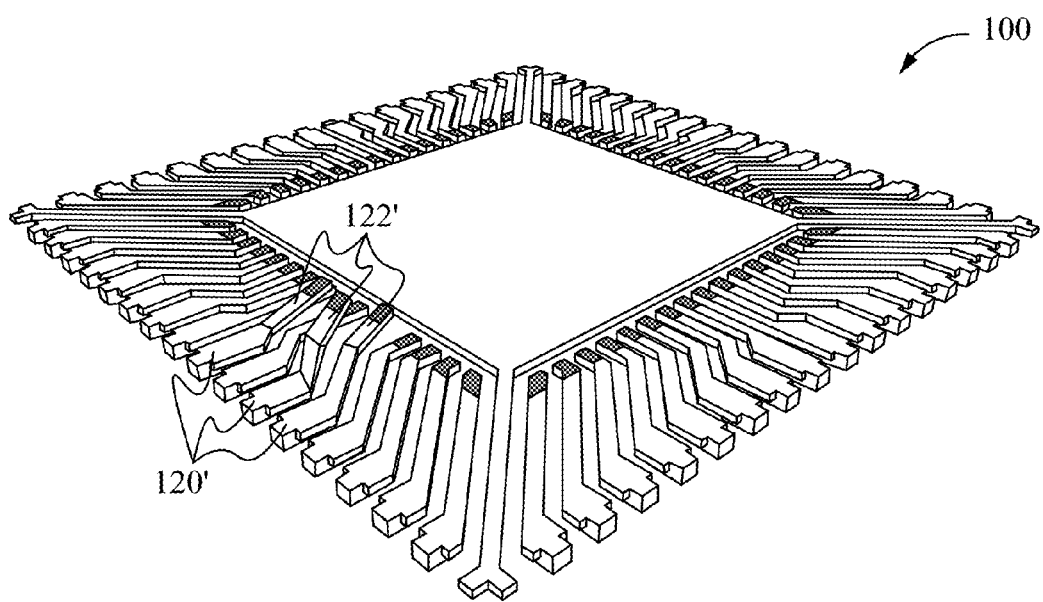
FIG. 1E shows a prior art leadframe damaged from improper handling.
Figure 2A:
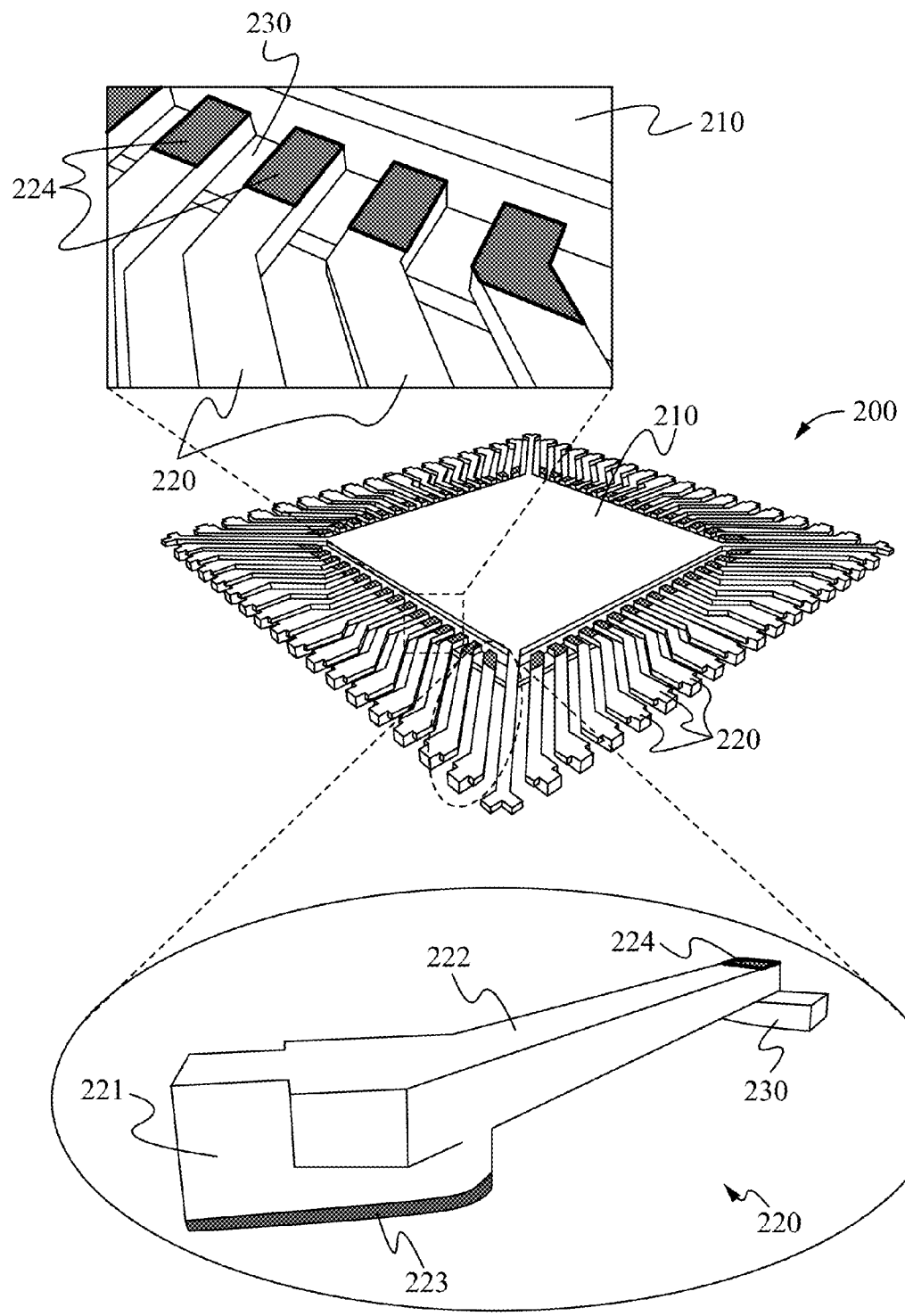
FIG. 2A shows a top view of a leadframe according to some embodiments.

FIG. 2A shows a perspective top view leadframe 200 per an embodiment of the current invention. The leadframe 200 can be formed, for example, by an etching process from a monolithic sheet of metal, such as copper. Etching techniques for forming leadframes are well known in the prior art, and need not be described in detail in this disclosure. In general, areas in a monolithic sheet of metal that are desired to form a particular structure are coated in an etch resist material or plated in an etch resistant metal. When the monolithic sheet is submerged or otherwise affected by a material that etches metal, the undesired portions are etched away, leaving behind desired portions protected by plating or coating. Furthermore, etching can be done for prescribed periods of time so that only some of the entire thickness of a monolithic sheet of metal is etched away. The leadframe 200 as formed comprises a die attach pad 210 and a plurality of contact leads 220 that extend outward from the die attach pad 210. Each contact lead 220 has a bond pad 224 on the top surface of a proximal end with respect to the die attach pad 210. The bond pad 224 is generally a silver, gold, nickel, palladium plating, or any alloy combination thereof, or plating with any other useful material or combination of materials for effectuating the mounting of a bond wire in a later processing step. The contact lead 220 further comprises a full thickness portion 221 at a distal end with respect to the die attach pad 210. The full thickness portion 221 at the distal end and the bond pad 224 at the proximal end are joined by a partial thickness portion 222. As described above, a pattern in a monolithic sheet of metal can be partially etched to form structures of varying thicknesses. A contact pad 223 is plated onto the bottom surface of the full thickness portion 221 for contacting and being soldered to an application, such as a printed circuit board. Advantageously, the partial thickness portion 222 enables electrical connectivity between the bond pad 224 and the contact pad 223 but can be encased in a mold compound such that it is no longer exposed in a later processing step, thereby shielding the partial thickness portion 222 from potential short circuit or undesired electrical contact.

Figure 2B:
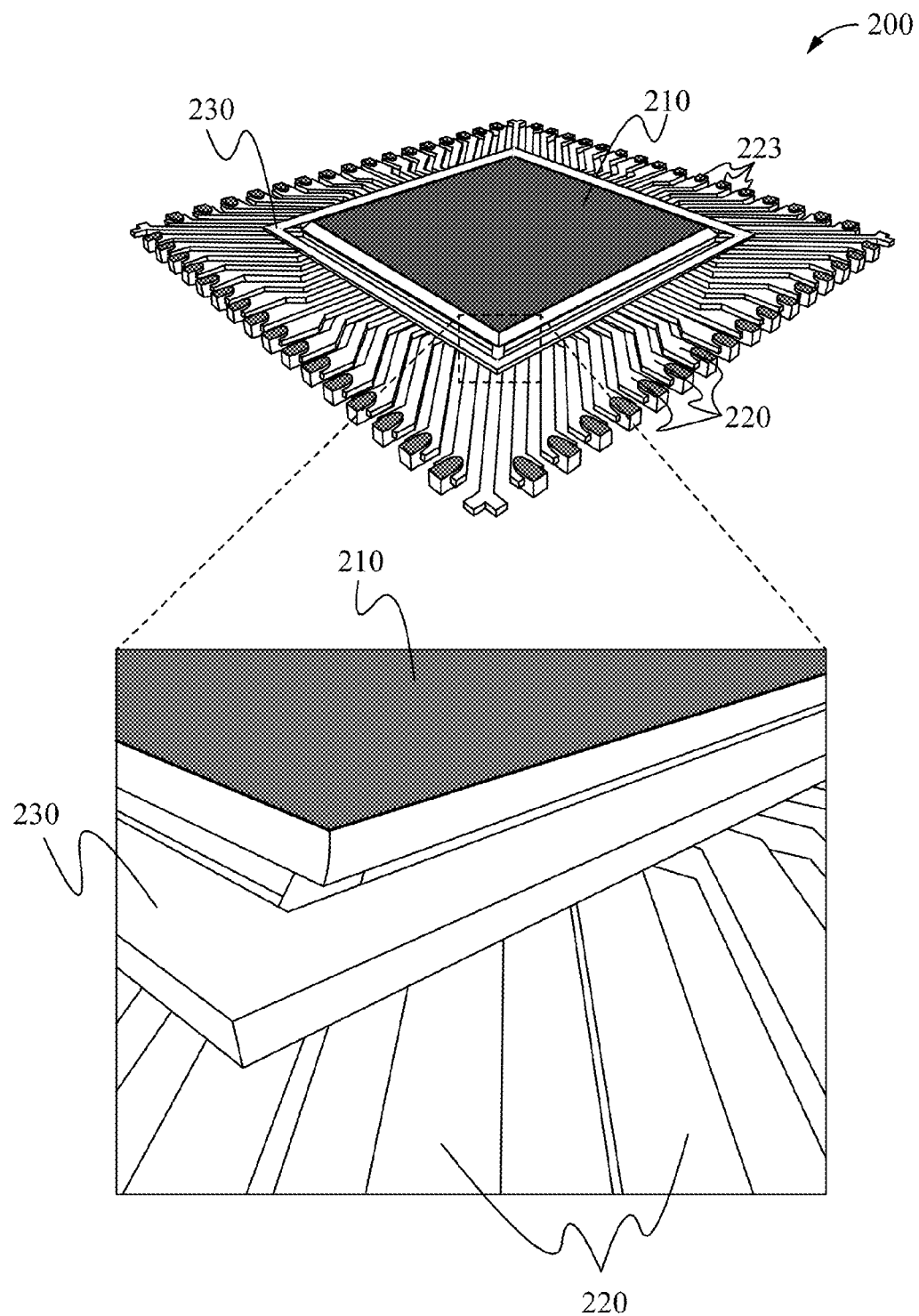
FIG. 2B shows a bottom view of a leadframe according to some embodiments.

The leadframe 200 further comprises an auxiliary support member 230. The auxiliary support member 200 at least partially circumscribes the die attach pad 210 and can be formed in a partial etching process so that it is integrally formed with the contact leads 220. Alternatively, the auxiliary support member 230 can be mounted or soldered in place in a separate processing step. Preferably, the auxiliary support member 230 is formed as an enclosed structure that lends structural support to the partial thickness portion 222, and in particular the bond pad 224. As shown in FIG. 2B, which shows a bottom perspective view of the leadframe 200, the auxiliary support member 230 circumscribes the die attach pad 210 and supports the proximal ends of the contact leads 220. Preferably, the combined thickness of the bond pad 224, partial thickness portion 222 and the auxiliary support member 230 is approximately equal to the combined thickness of the full thickness portion 221 and the contact pad 223. Therefore, upon operation of a wire bonding machine, the leadframe 200 will be substantially planar and effectuate ease of manufacturing. Preferably, the bottom surface of the die attach pad 210 and the contact pads 223 are plated with gold, silver, palladium or nickel to effectuate a stronger weld when the device is mounted into an application, such as a printed circuit board and also as an etch resist in a later etching step for removing the auxiliary support member 230.

Figure 2C:
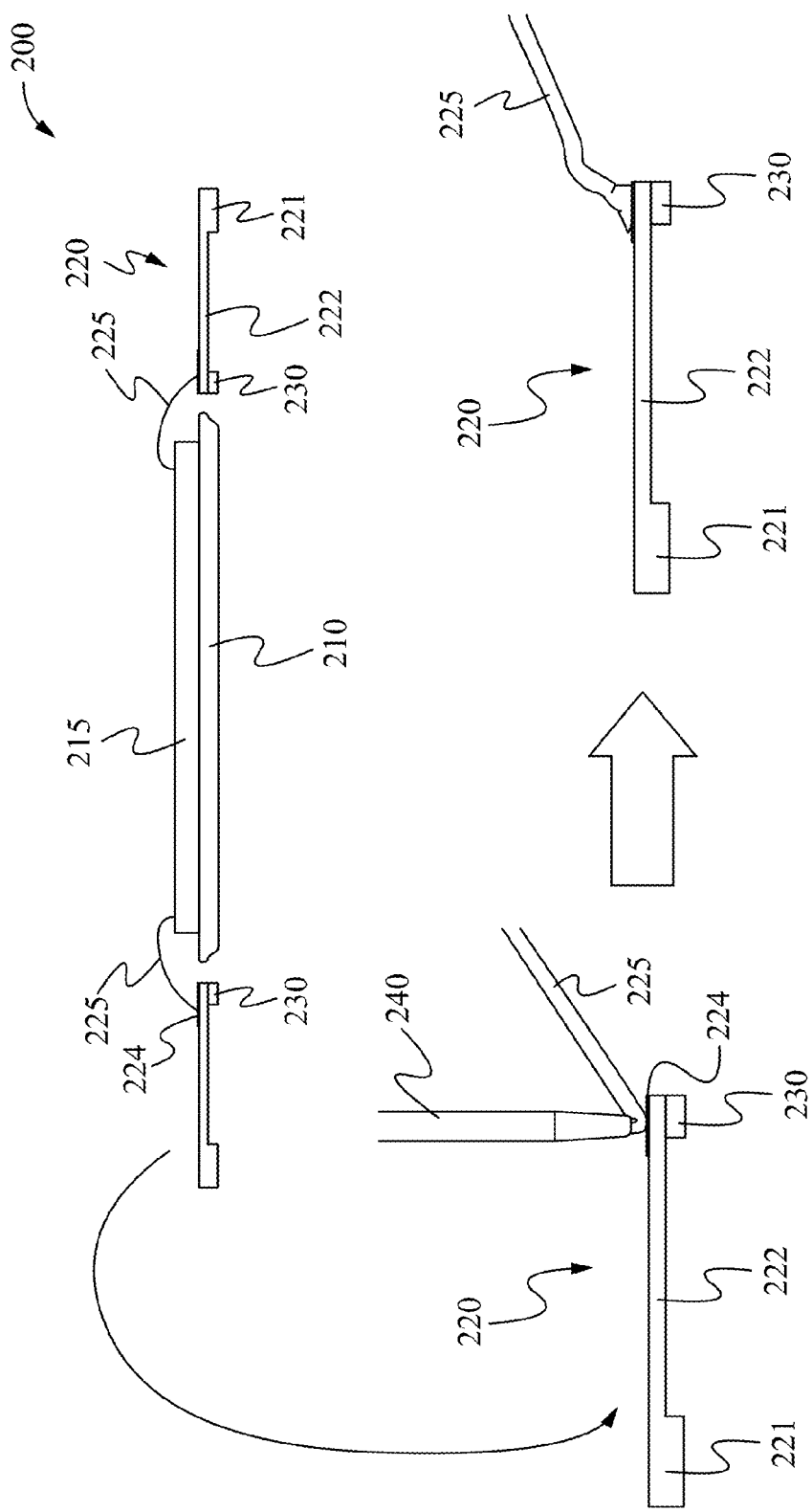
FIG. 2C shows a cross section of a leadframe according to some embodiments.

FIG. 2C shows the leadframe 200 in cross section. A semiconductor die 215 is mounted on the die attach pad 210. A bond wire 225 is connected from the semiconductor die 215 to the bond pad 224 at the proximal end of the contact lead 220. The bond wire 225 is mounted by a capillary 240 which exerts pressure on the bond pad 224 in order to effectuate sufficient force as to permanently bond the bond wire 225 to the bond pad 224. As discussed above, the partial thickness portion in a prior art configuration bends under such pressure. Advantageously, the auxiliary support member 230 provides a normal force to the capillary 240 and prevents any bending. As a result, the contact lead 220 does not bend and the bond wire 225 does not detach from the bond pad 224 after the capillary 240 is removed.

Figure 2D:
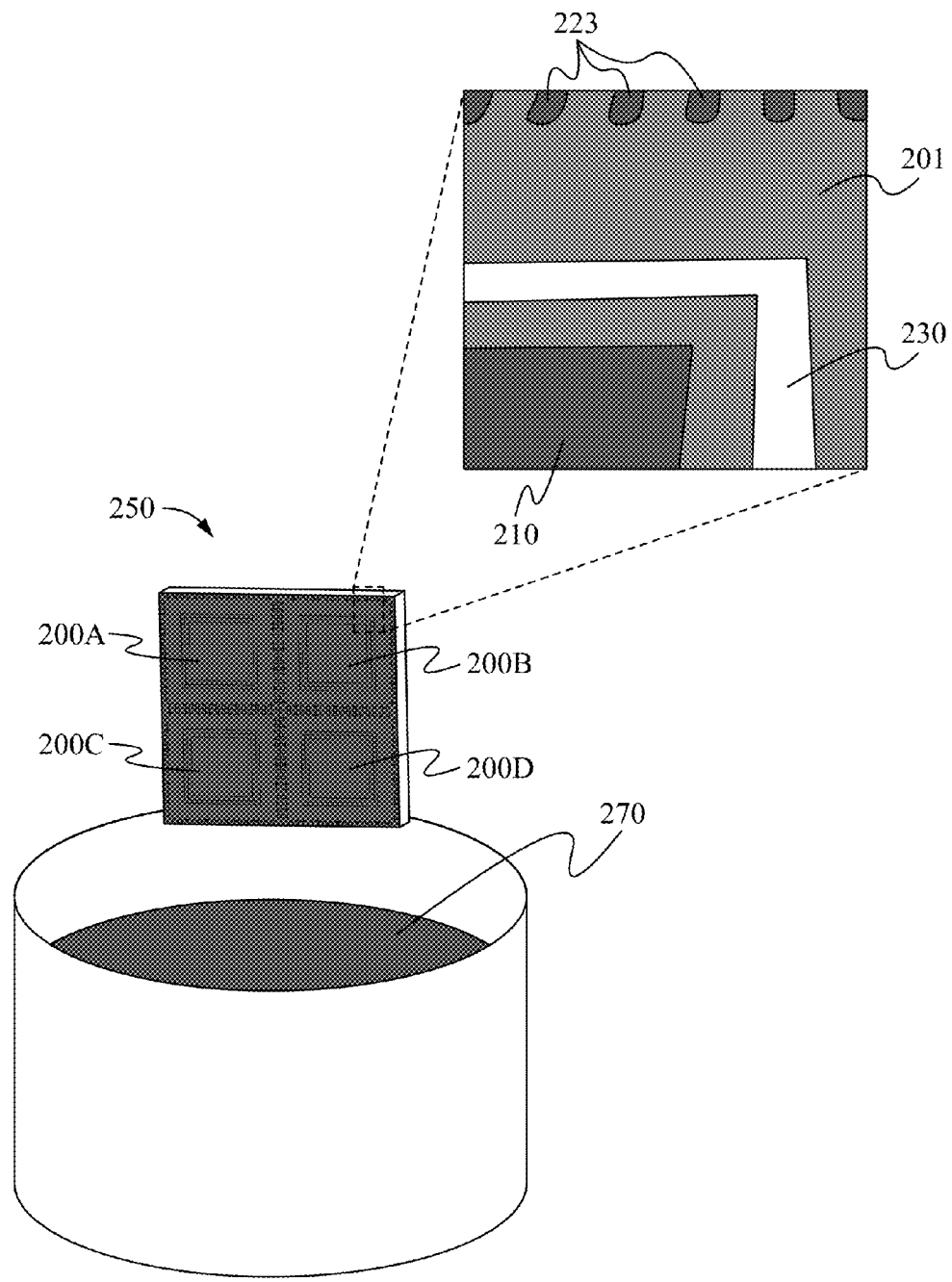
FIG. 2D shows a processing step according to some embodiments.
Figure 2E:
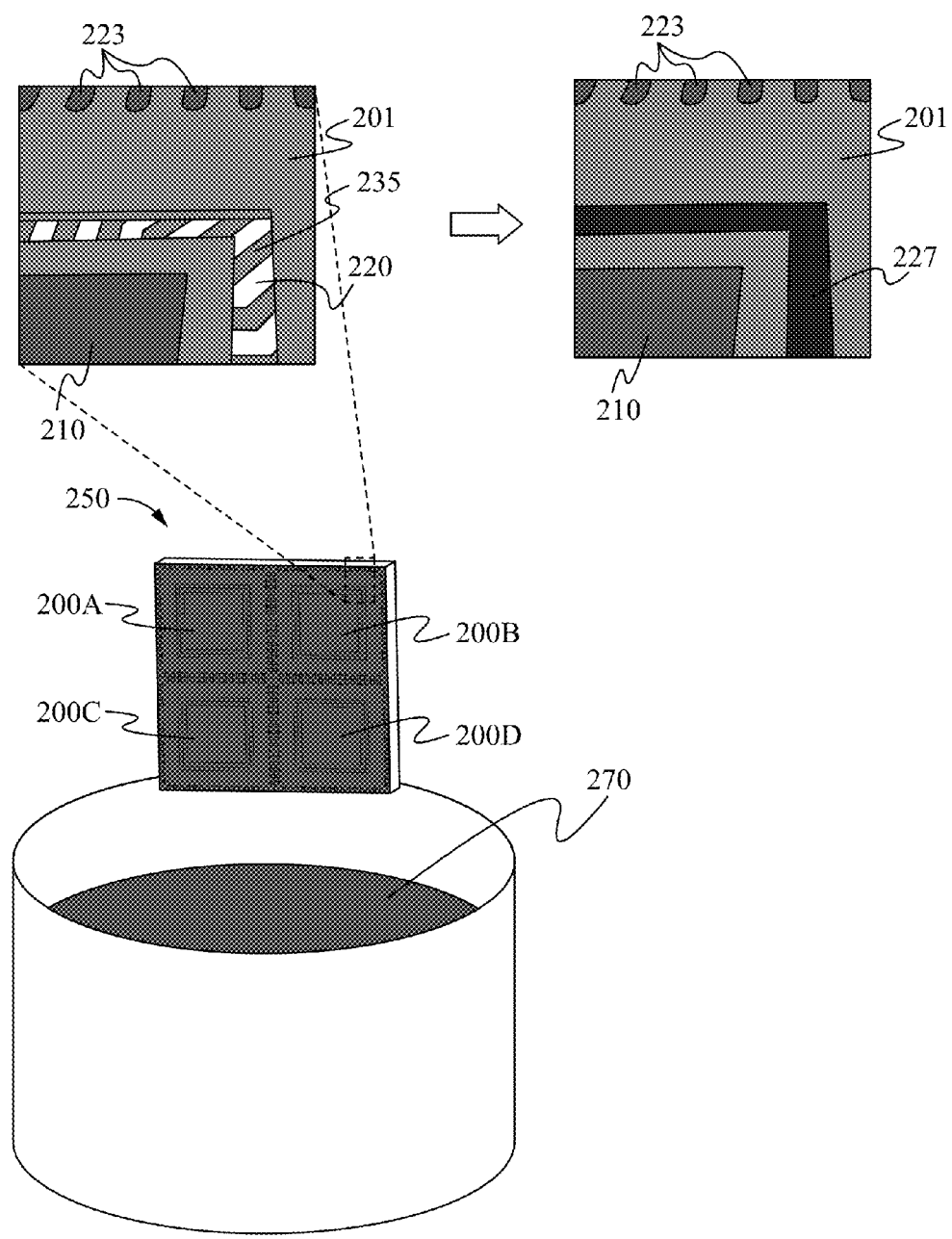
FIG. 2E shows a processing step according to some embodiments.

FIG. 2D shows an etching step for removal of the auxiliary support member 230 after an encasing step that is not shown for the sake of brevity and clarity. Molding steps are well known in the art of semiconductor packaging and need not be recounted in detail here. Generally, a leadframe in matrix form is encased in a suitable mold compound in a hot liquid state that dries and cools to form a plastic encapsulant, lending protection and support to all internal structures and elements. As can be appreciated, the auxiliary support member 230 electrically shorts all of the contact leads 220 together in addition to providing support. As a result, it should be removed. As discussed above, the bottom surfaces of the die attach pad 210 and the contact pads 223 are plated in an etch resistant material, whereas the bottom surface of the auxiliary support member 230 is left exposed. In general, the leadframe 210 is formed in a matrix 250 having a plurality of leadframes 200A, 200B, 200C and 200D for greater throughput during the manufacturing process. The matrix 250 is submerged in a vat 260 having an etching solution 270 that acts on the metal from which the leadframe 200 was formed, preferably copper. FIG. 2E shows the encased leadframe 200 after an etching step. The etching step has sacrificed the auxiliary support member 230. In FIG. 2E, the bottom surface of the leadframe 200 is shown with a groove 235 in place of the support structure 230 of FIGS. 2A-2D. The support structure 230 is no longer needed as the contact leads 230, including the partial thickness portion 222 of FIG. 2A-2D, are encased in a mold compound 201 that obviates the need for any further support. In some embodiments, the groove 235 is filled in by an epoxy 227. The epoxy 227 can be filled by a dispenser or a screen print over a stencil. Both methods are well known in the prior art and need not be recounted here.

Figure 2F:
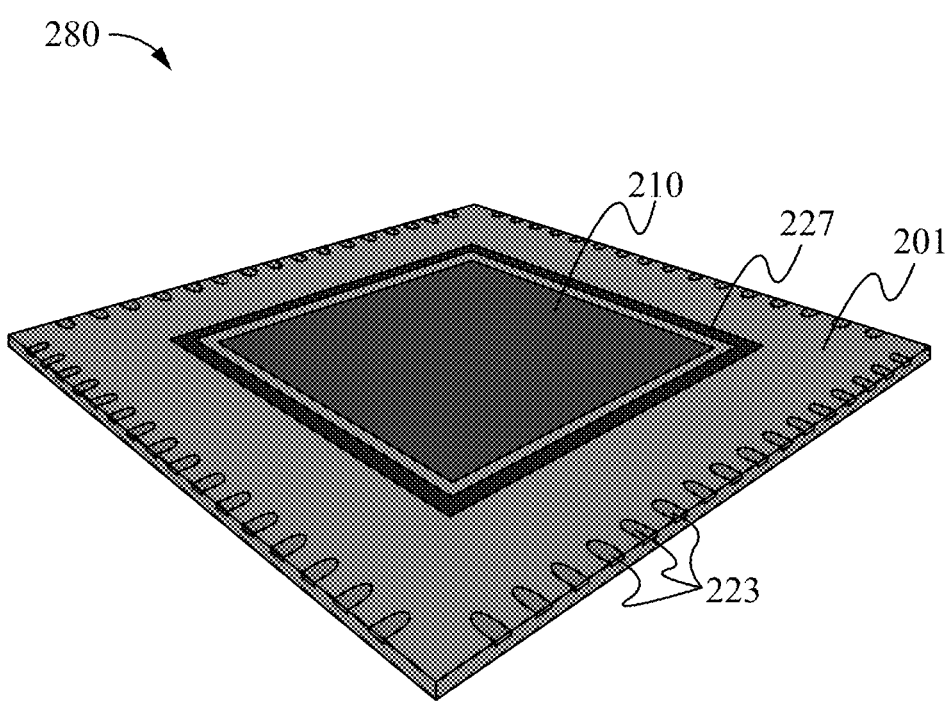
FIG. 2F shows a completed semiconductor package according to some embodiments.

FIG. 2F shows an embodiment of a finished semiconductor package 280 shown from a bottom view. The contacts 223 are exposed along with the bottom surface of the die attach pad 210. In general, the bottom surface of the die attach pad 210 provides a low thermal resistance to withdraw waste heat from the semiconductor die 215 of FIG. 2D. The bottom surface of the die attach pad 210 is generally thermally coupled to a heat slug for that purpose. The contact pads 223 function as input/output for the integrated circuit. The groove, now filled with epoxy 227, circumscribes the die attach pad 210. However, the person of ordinary skill having the benefit of this disclosure will readily appreciate that the groove need not entirely encompass the die attach pad 210. Preferably, the bottom surface of the semiconductor device 280 is substantially planar for effectuating proper coupling into application, such as a printed circuit board.

Figure 3A:
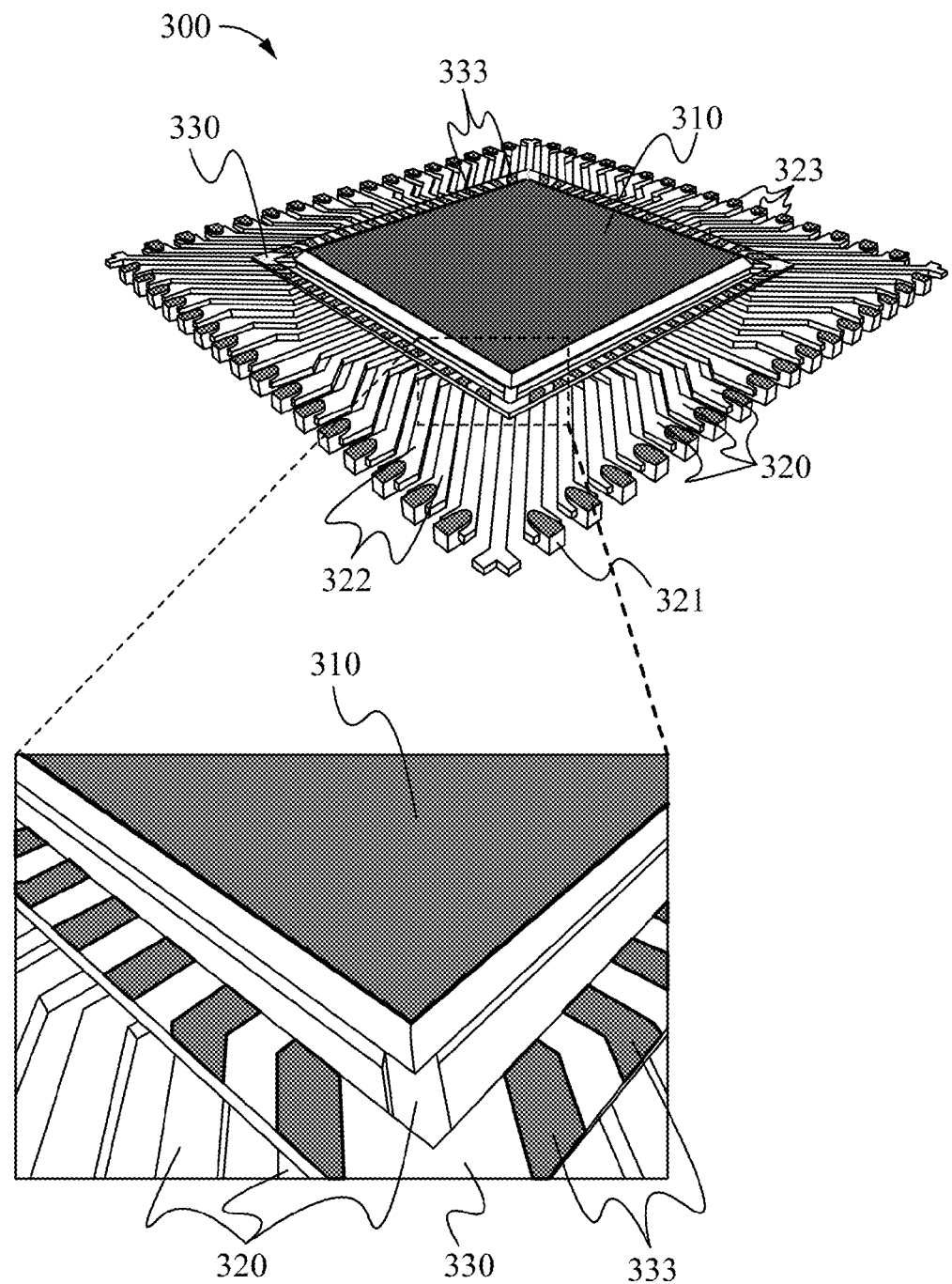
FIG. 3A shows a bottom view of a leadframe according to some embodiments.

In some applications, more contact points are needed between a semiconductor device and an application to effectuate a more robust electrical connection between the application, such as a printed circuit board, and the semiconductor device. To that end, FIG. 3A shows an alternate embodiment of the instant invention from a bottom perspective view. A leadframe 300 is formed by an etching a pattern onto a monolithic metal substrate as described above. FIG. 3A shows the leadframe 300 from a bottom view. The leadframe 300 comprises a die attach pad 310 and a plurality of contact leads 320. Each contact lead 320 comprises a partial thickness portion 322 and a full thickness portion 321. The full thickness portion 321 is plated with a metal such as gold, silver, nickel palladium or the like forming a contact pad 323. Similarly to the embodiment described in FIGS. 2A-2F, the contact pads 323 on the bottom surface of the full thickness portion 321 are exposed when the leadframe is encased in a mold compound in a later molding process. The leadframe 300 further comprises an auxiliary support member 330. The auxiliary support member 330 circumscribes the die attach pad 310 and is formed under the contact leads 320. In the embodiment of FIG. 3A, the auxiliary support member 330 comprises plated portions 333. Preferably, the plated portions 333 are plated to correspond to particular areas of the auxiliary support member 330 that are directly below the contact leads 320 such that when the auxiliary support member 330 is sacrificed in a later etching step, the plated portions 333 remain and will be the same thickness as the full thickness portions 321. Therefore, after a later molding process, the plated portions 333 are exposed on a bottom surface of a resulting semiconductor package. As a result, the plated portions 333 are useful as a second set of contact pads for effectuating a more robust electrical connection between a semiconductor die and the application in which the semiconductor device is placed.

Figure 3B:
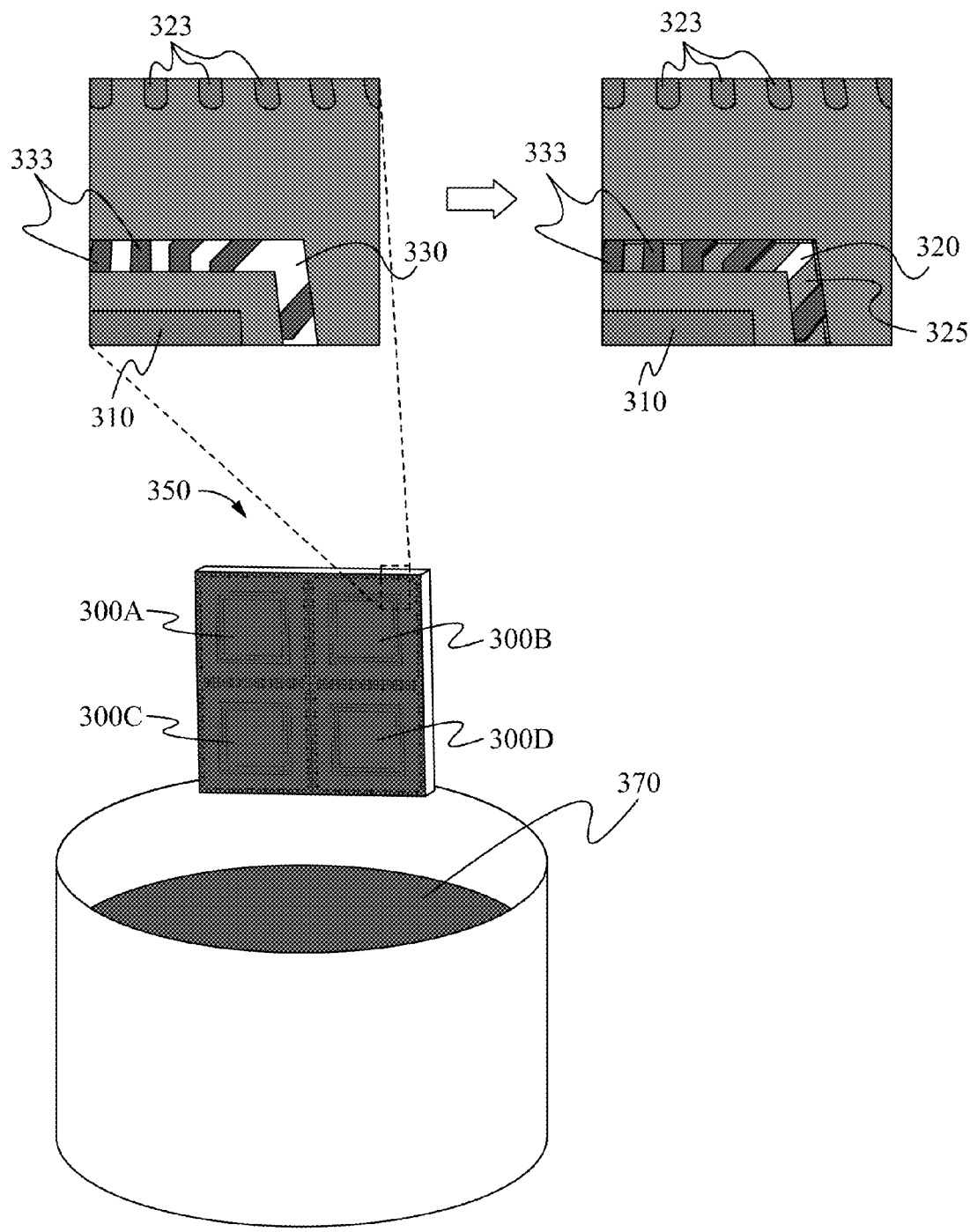
FIG. 3B shows a processing step according to some embodiments.

FIG. 3B shows a matrix 350 of leadframes 300A 300B 300C and 300D undergoing an etching process for sacrificing or otherwise removing the auxiliary support member 330. The plated portions 333, the contact pads 323 and the bottom surface of the die attach pad 310 are resistant to etching solutions. As a result, the exposed portions of the auxiliary support member 330 will dissolve when the matrix 350 is submerged in a vat 360 having an etching solution 370. What is left behind is a groove 325 intermittently filled by the plated portions 333. Optionally, the groove 325 is filled with an epoxy by an injection or a screen and stencil step.

Figure 3C:
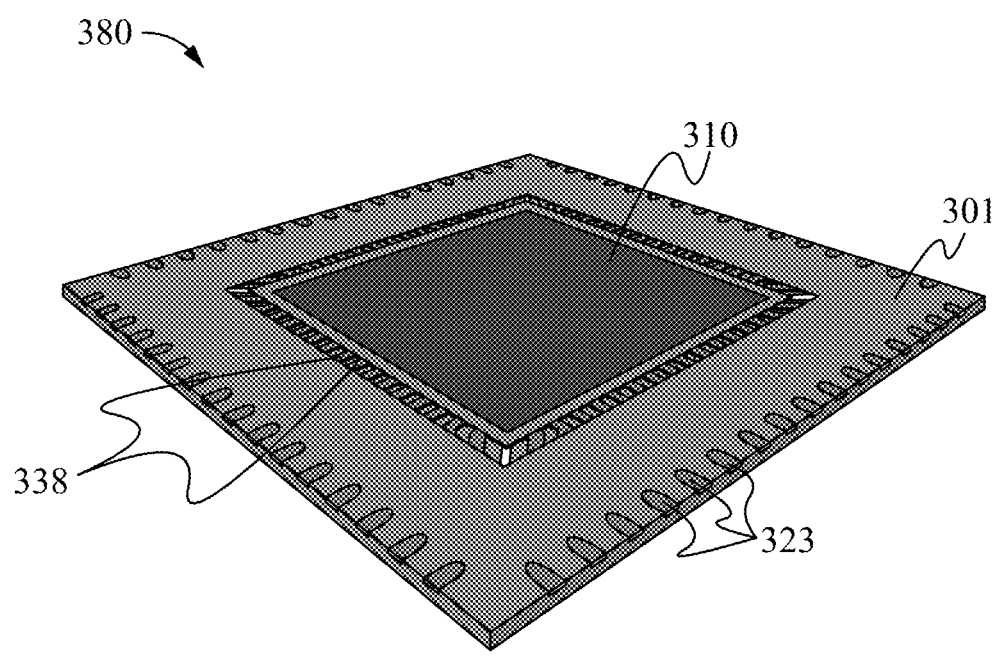
FIG. 3C shows a processing step according to some embodiments.

FIG. 3C shows an embodiment of a finished semiconductor package 380 shown from a bottom view. The contact pads 323 are exposed along with the bottom surface of the die attach pad 310. In general, the bottom surface of the die attach pad 310 provides a low thermal resistance to withdraw waste heat from a semiconductor die, such as 215 FIG. 2D. The bottom surface of the die attach pad 310 is generally thermally coupled to a heat slug for that purpose. The contact pads 323 function as input/output for the integrated circuit. The groove 325 comprises another set of contact pads 333 and circumscribes the die attach pad 310. However, the person of ordinary skill having the benefit of this disclosure will readily appreciate that the groove need not entirely encompass the die attach pad 310. Preferably, the bottom surface of the semiconductor device 380 is substantially planar for effectuating proper coupling into application, such as a printed circuit board.

Figure 4:
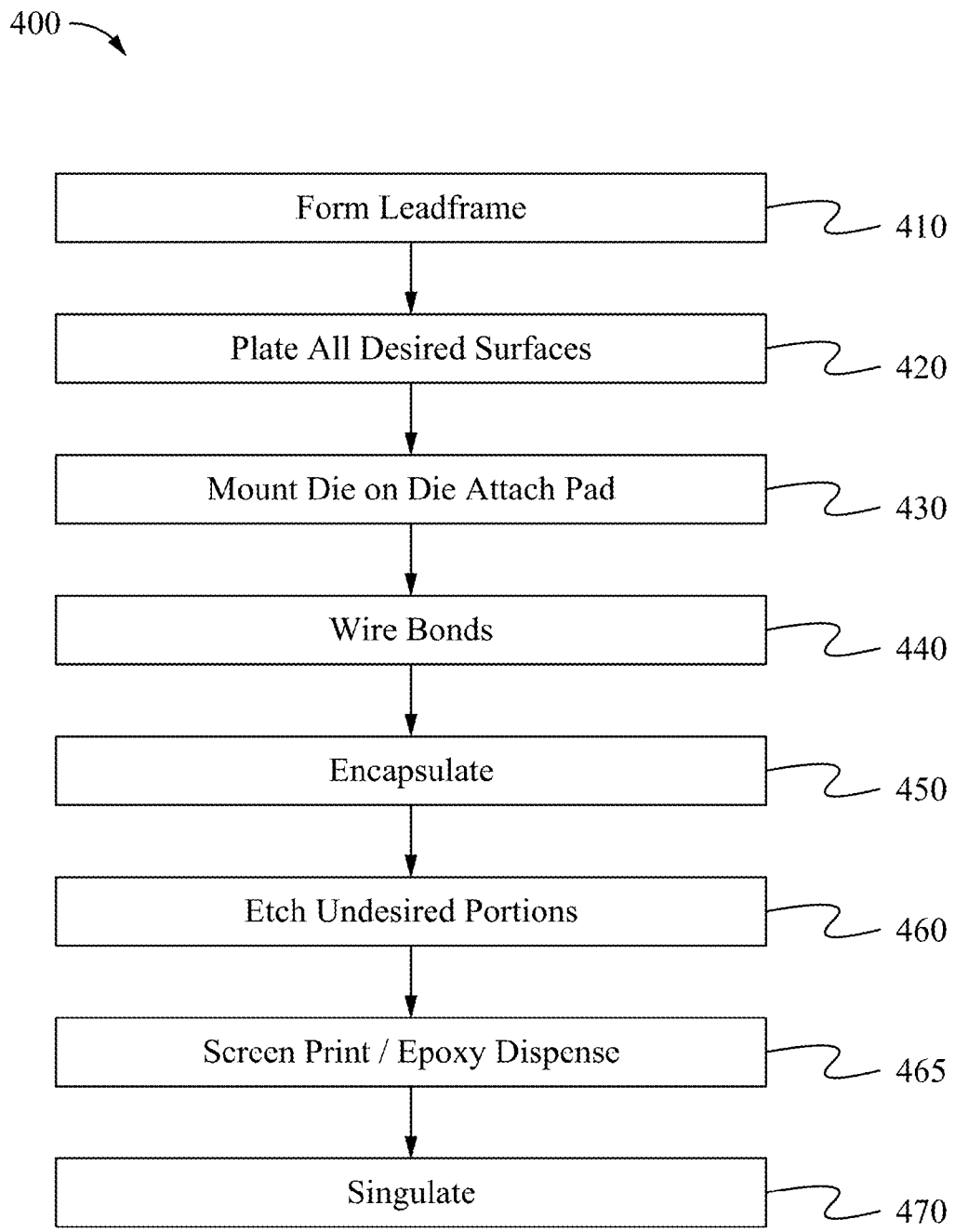
FIG. 4 shows a process flowchart according to some embodiments.

FIG. 4 is a flowchart diagram of a method 400 for manufacturing a semiconductor package as described in the preceding Figures. In a step 410, a leadframe is formed by etching a desired pattern from a monolithic metal substrate by plating or coating desired portions of the substrate and allowing the remaining portions to be sacrificed by an etching solution. Preferably, forming a leadframe comprises forming a die attach pad, a plurality of contact leads each having a full thickness portion and a partial thickness portion, and an auxiliary support member for providing support to the partial thickness portion during a later wire bonding step. In a step 420, portions defining contact pads and the die attach pad are plated in an etch resist material for a later etching step. As described above, in some embodiments, the entirety of the auxiliary support member is left unplated such that the whole auxiliary support member is sacrificed in a later etching step. Alternatively, a pattern is etched onto the auxiliary support member such that a second set of contact pads is formed when the auxiliary support member is partially sacrificed in a later processing step. In a step 430, a die is mounted on the die attach pad. In a step 440, wire bonds are placed between contact pads on a proximal end of each of the contact leads and the die, thereby effectuating electrical contact therebetween. In a step 450, the leadframe, die, and wire bonds are at least partially encapsulated in a mold compound. Preferably, the bottom surfaces of the contact pads, the die attach pad and the auxiliary support member are exposed as described above. In a step 460, the now encapsulated device is submerged or otherwise affected by an etching solution that etches unplated exposed areas. In some embodiments, the entirety of the auxiliary support member is sacrificed. Alternatively, portions of the auxiliary support member are sacrificed leaving behind a second set of contact pads. Advantageously, the contact pads are electrically isolated with respect to each other upon etching the auxiliary support member. Optionally, in a step 465, the groove can be filled with an epoxy or other suitable material through a screen printing process using a screen stencil or epoxy dispense using a dispenser. Although the foregoing process has been described in the singular, it is well known in the art of semiconductor manufacturing that leadframes are processed in matrix form with each matrix having a plurality of leadframes. To that end, in a step 470, the matrix is singulated to form individual packaged units such as the ones shown in FIGS. 2F and 3C.

Figure 5A:
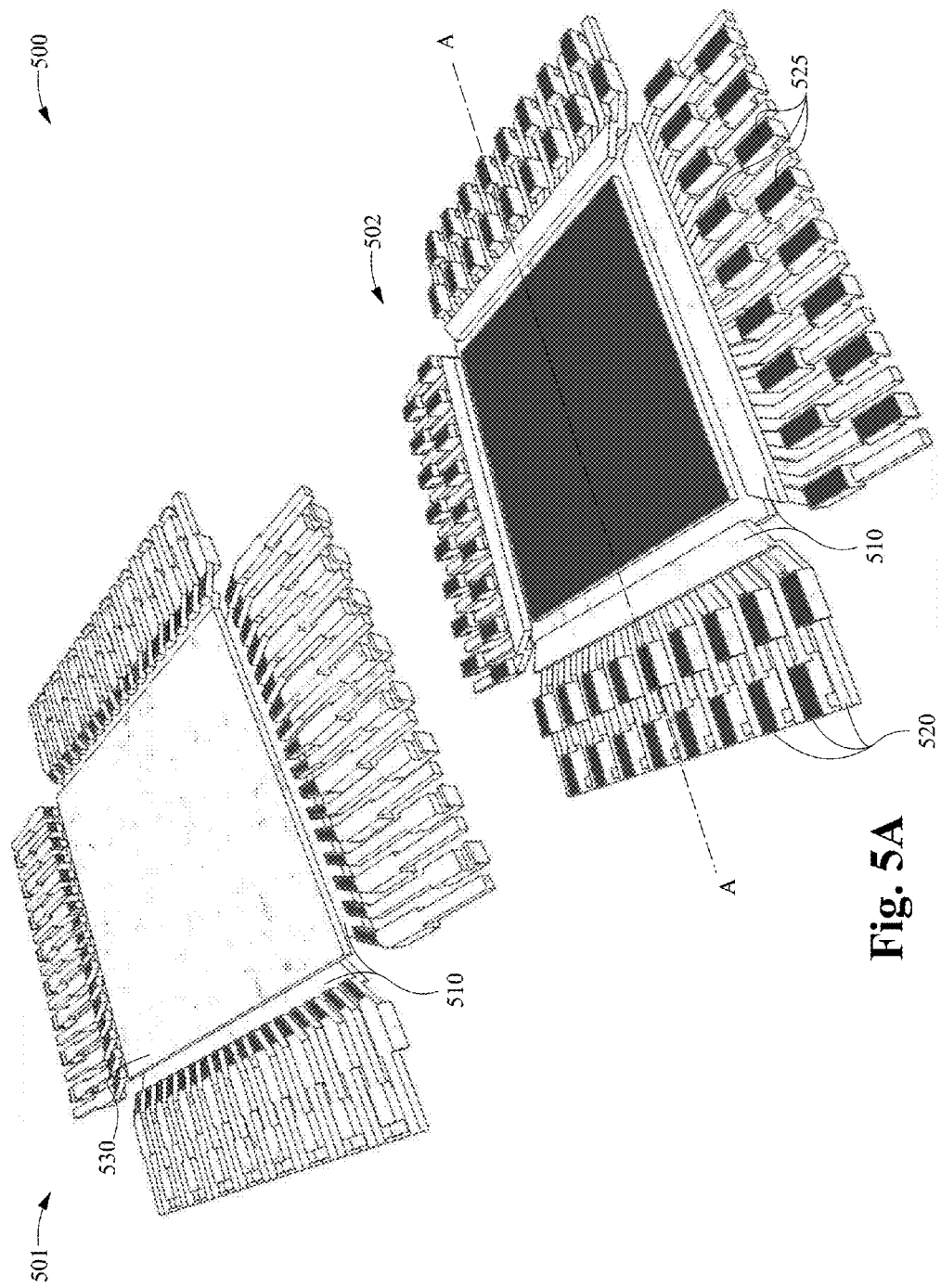
FIG. 5A shows a leadframe shown from a top view and a bottom view according to some embodiments.
Figure 5B:
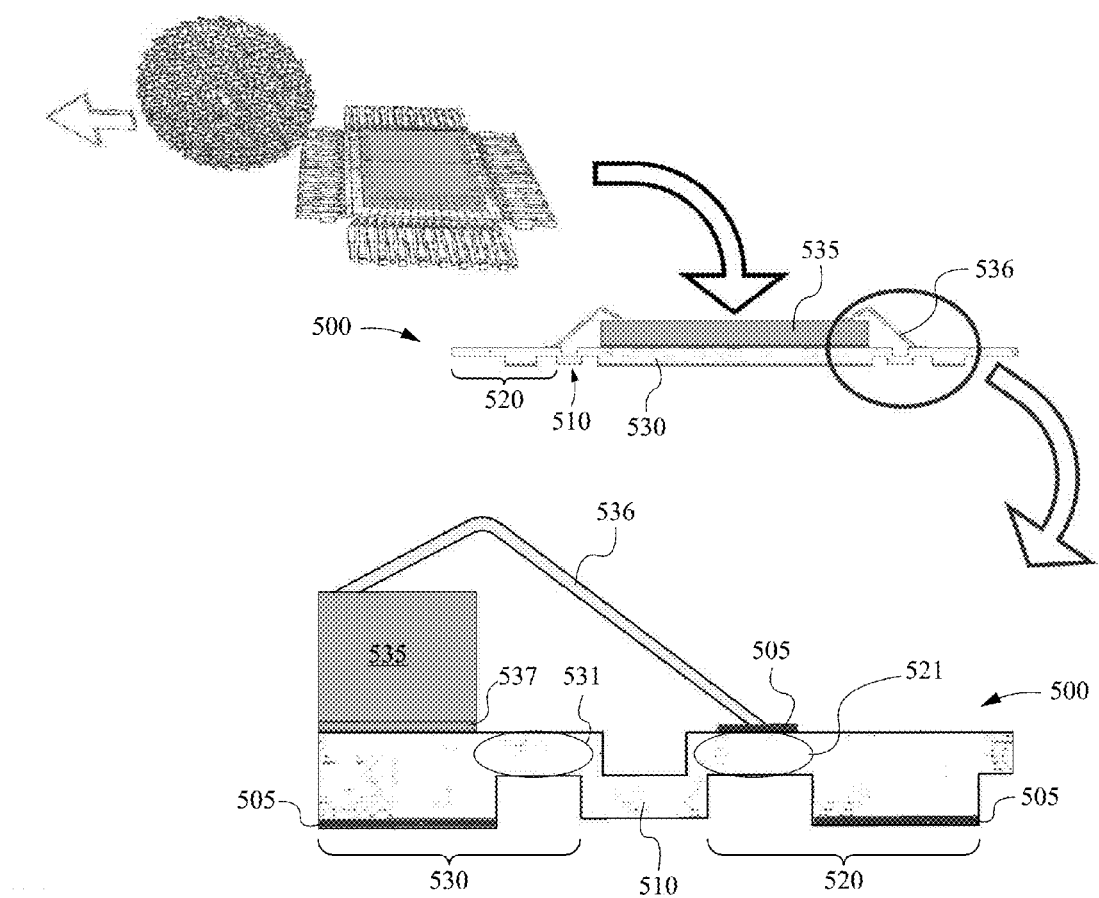
FIG. 5B shows a cross section of the leadframe in FIG. 5A along the line A according to some embodiments.
Figure 5C:
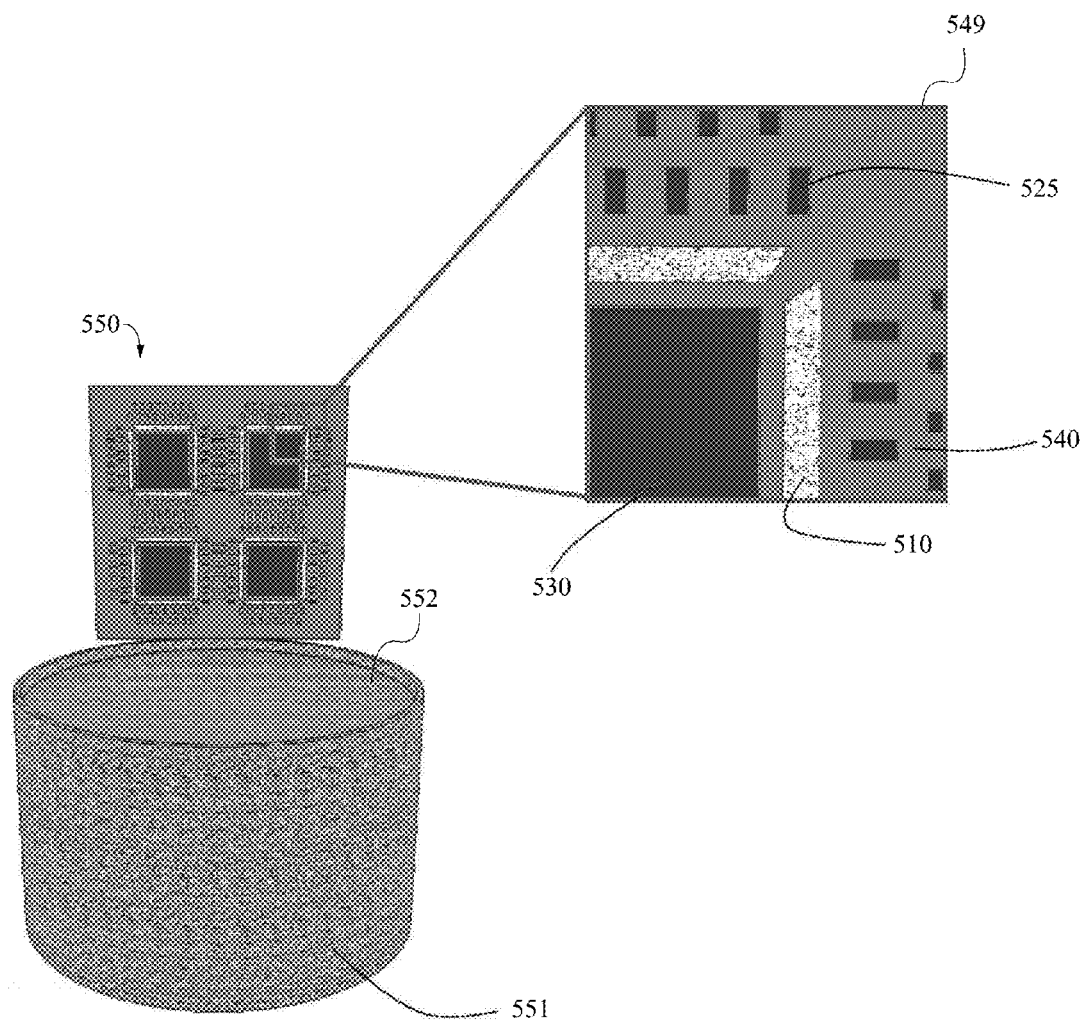
FIG. 5C shows an etching process for a matrix of molded leadframes according to some embodiments.

FIGS. 5A-5C show alternate embodiments of a leadframe 500 having a support structure 510. The leadframe 500 is shown from a top view 501 and a bottom view 502. The leadframe 500 comprises a die attach pad 530 and several contact leads 520 that are held stationary to the die attach pad 530 by an auxiliary support structure 510. The contact leads 520 are staggered such that every other contact pad 525 is near the die attach pad 530 and every other contact pad 525 is further from the die attach pad 530. Such staggering of the contact pads 525 enables greater contact pad footprint density by enabling two rows of contact pads on a mounting surface of the completed package (shown later). In the exemplary embodiment of FIG. 5A, there are four auxiliary support structures 510, one on each side of the die attach pad 530. The several contact leads 520, support members 520 and die attach pad 530 can be formed by partial etching processes performed on a monolithic sheet of metal, preferably copper. On the bottom surface of the leadframe 500, areas which contact a final application, such as a printed circuit board (PCB), are plated. These plated areas comprise the bottommost surface of the contact pads 525 and the die attach pad 530 (shown in grey). Generally, the embodiment of FIG. 5A and the proceeding Figures are directed towards any issues which may arise due to the thickness of the leadframe 500 where a wirebond is to be placed.

FIG. 5B shows the leadframe 500 in FIG. 5A in cross section along the line A, and having a semiconductor die 535 mounted on the die attach pad 530 and electrically coupled to the several contact leads 520 by wirebonds 536. In the close up drawing, the die 535 is shown mounted to the die attach pad 530 by an adhesive or tape 537. The wirebonds 536 are mounted to the contact lead 520 on a plated area 505 above a first support protrusion 521. The auxiliary support structure 510 is formed between the first support protrusion 521 and a second support protrusion 531 on the die attach pad 530. When the auxiliary support structure 510 is removed in a later processing step, the die attach pad 530 is electrically isolated from the several contact leads 520, which are in turn electrically isolated from each other. Advantageously, the wirebond 536 is mounted on the first support protrusion 521 while the auxiliary support structure 510 is still in place so that the first support protrusion 521 is not bent by the force of the applicator applying the wirebond 536 to thereon. The plated areas 505 on the bottom surface of the leadframe 500 corresponding to the die attach pad 530 and the contact pads 525 are exposed after the leadframe is encased in a mold compound in a later processing step. The auxiliary support structure 510 is not. When the molded leadframe 500 is exposed to an etching process, the plated areas 505 will not be affected by the etching process and the auxiliary support structure 510 will be removed.

FIG. 5C shows an etching process for a matrix 550 of molded leadframes according to some embodiments. It is generally understood that semiconductor devices are formed in matrix arrangements for greater manufacturing throughput. In the close up view 549, it is shown that the mold compound 540 surrounds and covers the bottom surface of the leadframe 500 except for the bottom surfaces of the auxiliary support structure 510 and the plated areas (the die attach pad 530 and the contact pads 525). The auxiliary support structure 510 is not plated and thus is exposed to the etching process. In this example, the matrix 550 is lowered into a vat 551 having etching solution 552 therein.

Figure 5D:
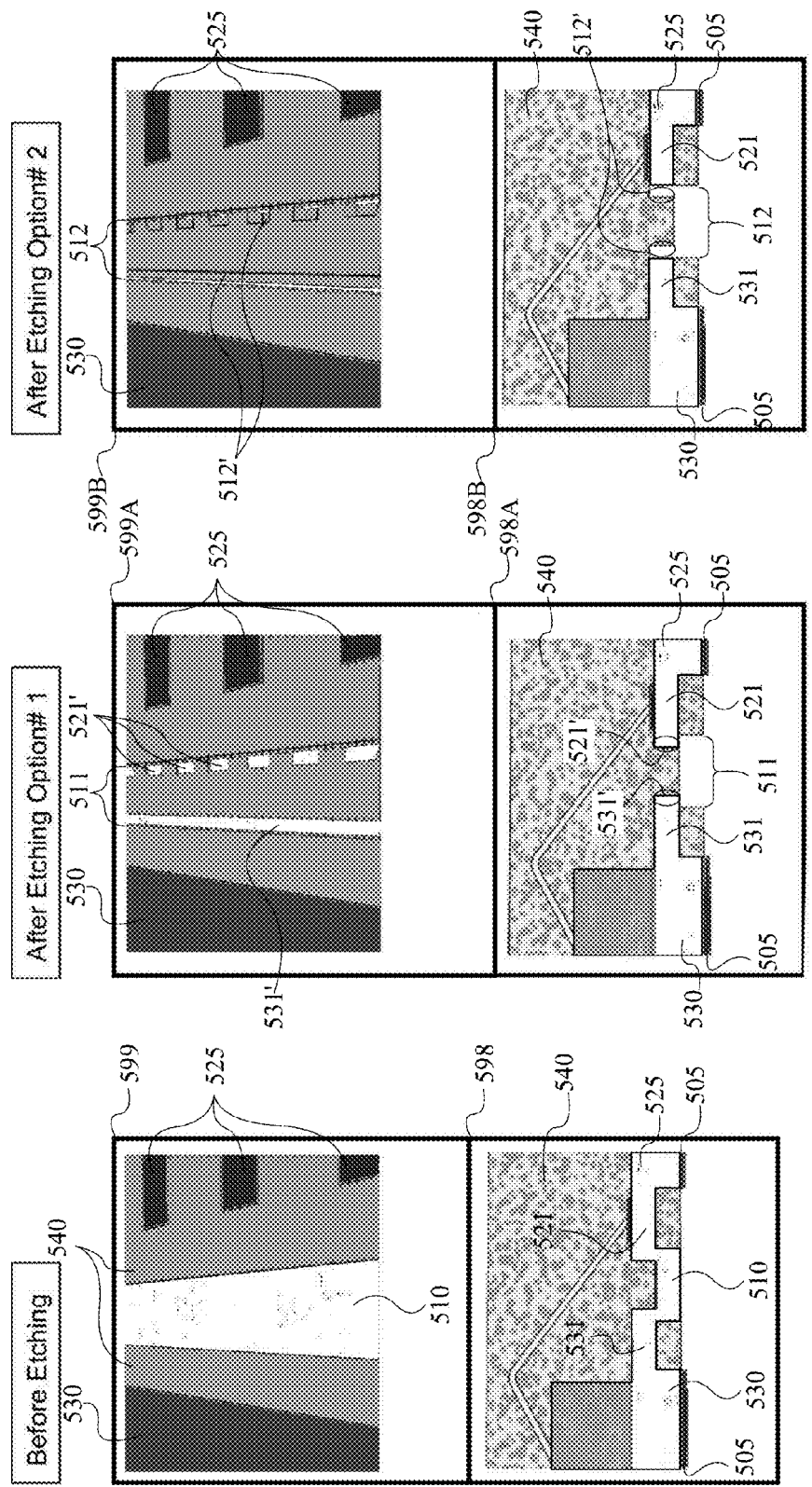
FIG. 5D shows optional results of the etching process of FIG. 5C according to some embodiments.

FIG. 5D shows optional results of the etching process of FIG. 5C. The before etching view on the left side of FIG. 5D shows a zoomed in view 599 and a cross section view 598 of the matrix 550 of FIG. 5C before the etching process has occurred. The die attach pad 530 and contact pads 525 are plated 505, but the auxiliary support structure 510 is not plated. FIG. 5D presents two exemplary etching options. The first etching option #1 is a partial thickness etching, removing only the auxiliary support structure 510, as shown in the middle zoomed in view 599A and the middle cross sectional view 598A. A simple rectangular groove 511 is formed upon removal of the auxiliary support structure 510. A bottom surface of the tip 521' of the first support protrusion 521 is exposed by the groove 511. Similarly, a bottom surface of the tip 531' of the second support protrusion 531 is also exposed by the groove 511. The groove 511 can be filled with an epoxy, mold compound, or any other material. The second etching option #2 is a full thickness etching, removing the auxiliary support structure 510 and the tips 521' and 531', as shown in the right zoomed in view 599B and the right cross sectional view 598B. In this example, a groove 512 is formed by the removal of the auxiliary support structure 510. Additionally, two additional voided areas 512' are formed. The tip 521' of the first support protrusion 521 along with the tip 531' of the second support protrusion 531 are etched away to form the additional voided areas 512'. Stated differently, the entire thickness of the leadframe 500 is etched through. The voided areas 512 and 512' can be filled with an epoxy, mold compound, or any other material, or left empty.

Figure 6A:
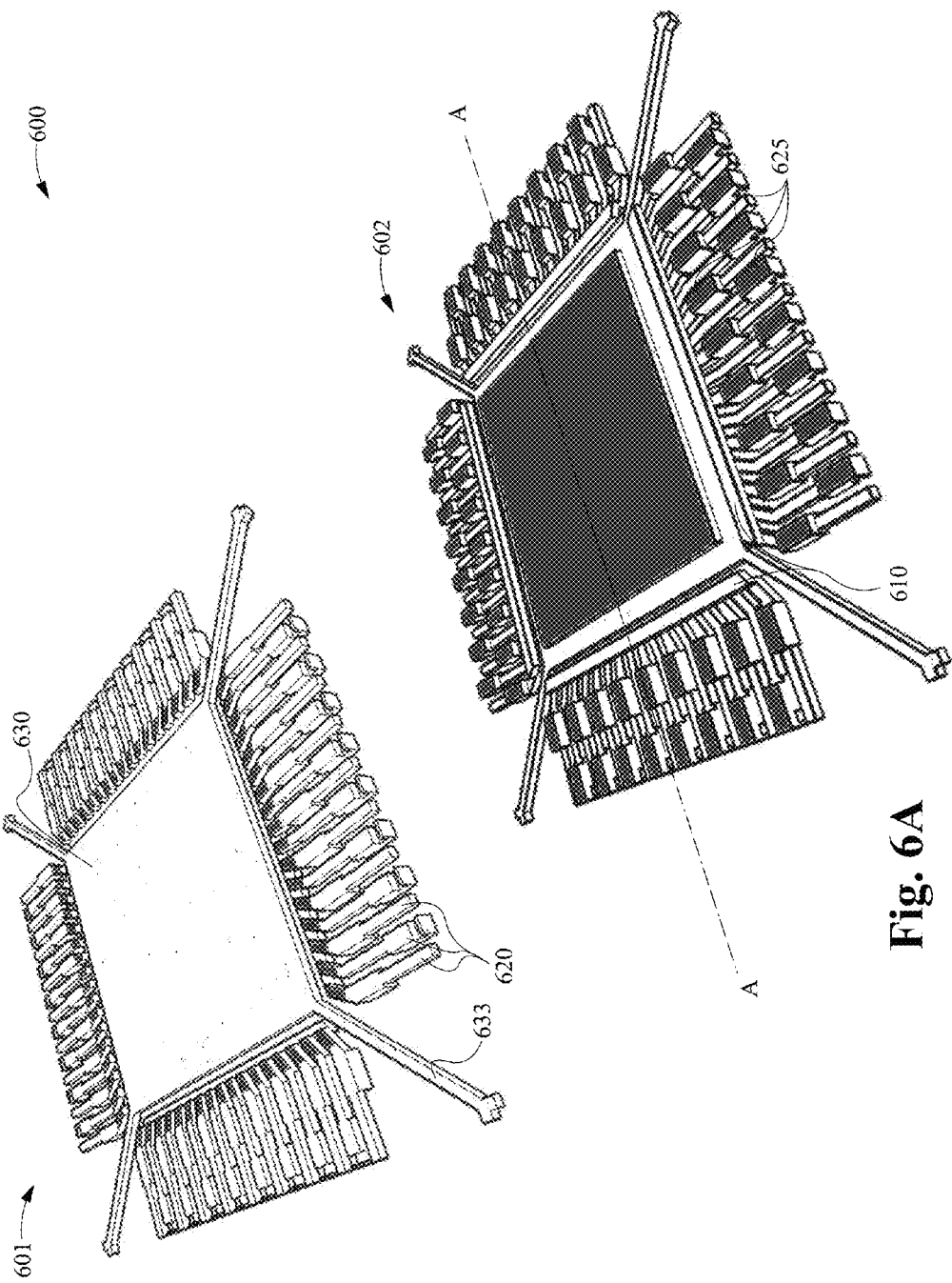
FIG. 6A shows a leadframe shown from a top view and a bottom view according to some embodiments.

FIG. 6A shows an alternate embodiment of a leadframe 600 shown from a top view 601 and a bottom view 602. Although "top" and "bottom" are discussed herein this embodiment and others, it is understood that a "top" surface is where a die is eventually mounted and a "bottom" surface is where the finished IC package is mounted to an end application, such as a PCB. "Top" and "bottom" are used for the sake of convenience but are not intended to limit any embodiment to cardinal directions or orientation. Similarly to FIG. 5A, the plated areas comprise the bottommost surface of the contact pads 625 and the die attach pad 630 (shown in grey). In the example of FIG. 6A, a each contact lead 620 couples to and shares an auxiliary support structure 610. The auxiliary support structure 610 is integrally formed with the contact leads 620 and does not contact the die attach pad 630. Further, the die attach pad 630 comprises one or more supporting legs 633 for preventing the leadframe 600 from bending or breaking especially along the auxiliary support structure 610.

Figure 6B:
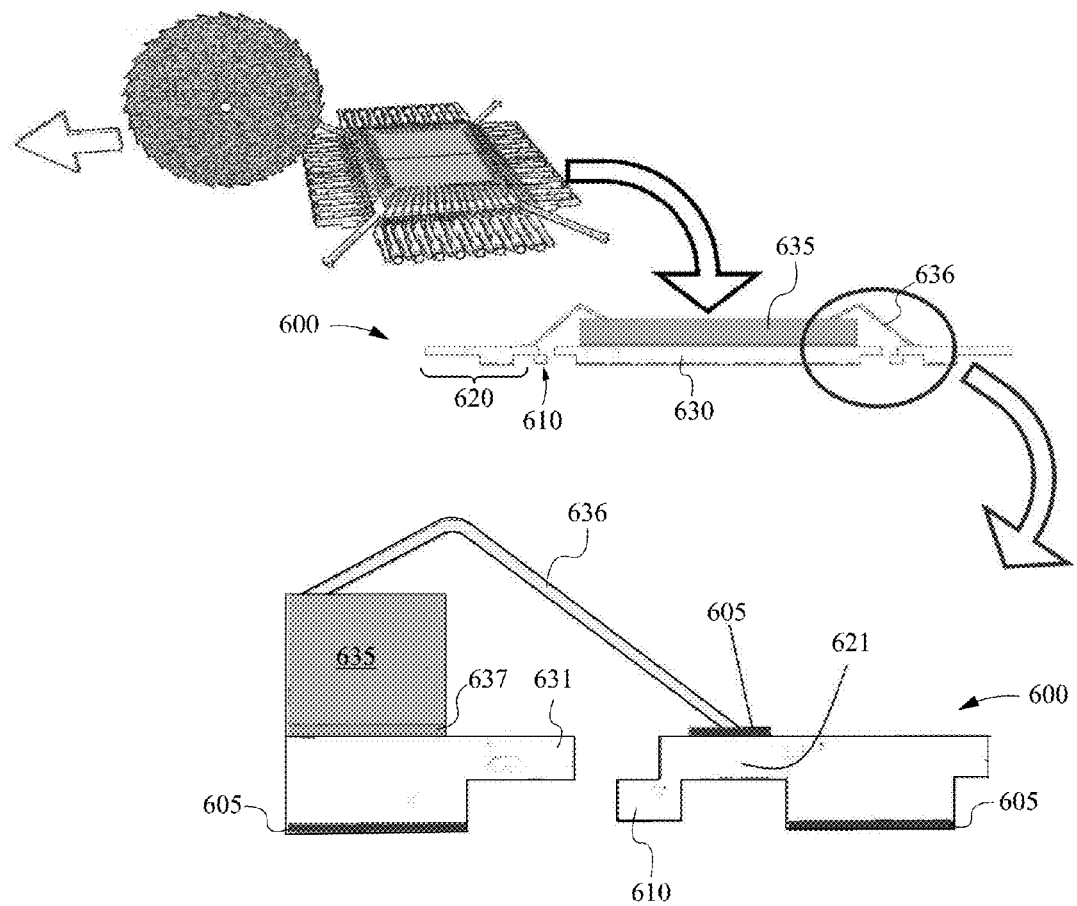
FIG. 6B shows a cross sectional of the leadframe in FIG. 6A along the line A according to some embodiments.

FIG. 6B shows the leadframe 600 in FIG. 6A in cross section along the line A, and having a semiconductor die 635 mounted on the die attach pad 630 and electrically coupled to the several contact leads 620 by wirebonds 636. In the close up view, the die 635 is shown mounted to the die attach pad 630 by an adhesive or tape 637. The wirebonds 636 are mounted to the contact lead 620 on a plated area 605 above a first support protrusion 621. The auxiliary support structure 610 is formed between the first support protrusion 621 and a second support protrusion 631 on the die attach pad 630. In the exemplary embodiment of FIGS. 6A-6D, the auxiliary support structure 610 is not attached to the second support protrusion 631. When the auxiliary support structure 610 is removed in a later processing step, the several contact leads 620 are electrically isolated from each other. Advantageously, the wirebond 636 is mounted on the first support protrusion 621 while the auxiliary support structure 610 is still in place so that the first support protrusion 621 is not bent by the force of the applicator applying the wirebond 636 to thereon. The plated areas 605 on the bottom surface of the leadframe 600 corresponding to the die attach pad 630 and the contact pads 625 are exposed after the leadframe is encased in a mold compound in a later processing step. The auxiliary support structure 610 is not. When the molded leadframe 600 is exposed to an etching process, the plated areas 605 will not be affected by the etching process and the auxiliary support structure 610 will be removed.

Figure 6C:
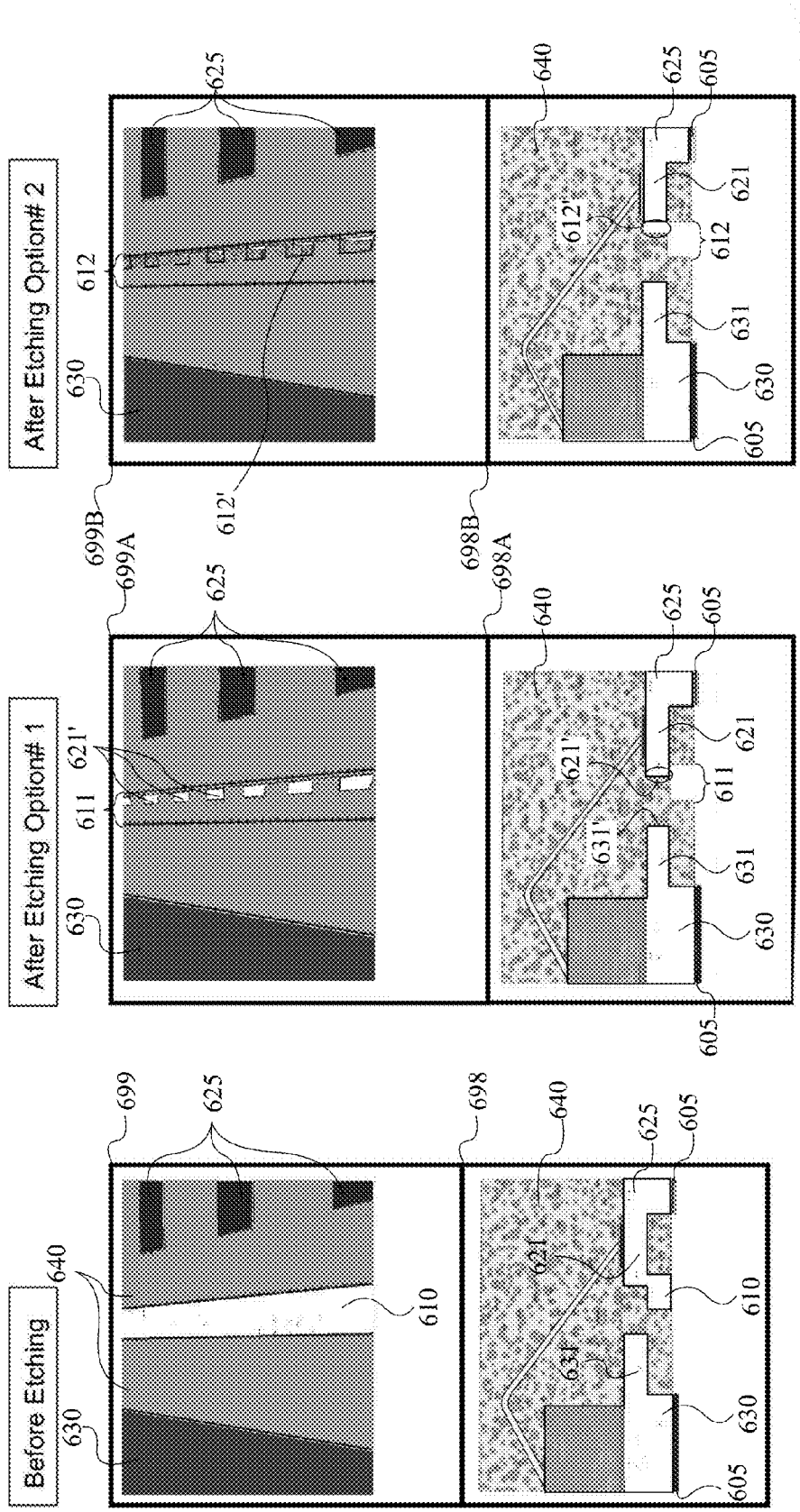
FIG. 6C shows optional results of the etching process of FIG. 5B according to some embodiments.

FIG. 6C shows optional results of the etching process of FIG. 5B with the leadframe 600. The before etching view on the left side of FIG. 6C shows a zoomed in view 699 and a cross section view 698 of the matrix 550 of FIG. 5C before an etching process. The die attach pad 630 and contact pads 625 are plated 605, but the auxiliary support structure 610 is not plated and the mold 640 is in between. FIG. 6D presents two exemplary etching options. The first etching option #1 is a partial thickness etching, removing only the auxiliary support structure 610, as shown in the middle zoomed in view 699A and the middle cross sectional view 698A. A simple groove 611 having a rectangular cross section is formed upon removal of the auxiliary support structure 610. In the embodiment of FIGS. 6A-6C, the groove 611 can be made more thin than the groove 511 of FIG. 5D since the auxiliary support structure 610 is not integrally formed with the die attach pad 630. A bottom surface of the tip 621' of the first support protrusion 621 is exposed by the groove 611. The groove 611 can be filled with an epoxy, mold compound, or any other material. The second etching option #2 is a full thickness etching, removing the auxiliary support structure 610 and the tip 621', as shown in right zoomed in view 699B and the right cross sectional view 698B. In this example, a groove 612 is formed by the removal of the auxiliary support structure 610. The groove 612 has an additional voided area 612'. The tip 621' of the first support protrusion 621 is etched away to form the additional voided area 612'. Stated differently, the entire thickness of the leadframe 600 is etched through. The voided area 612 and 612' can be filled with an epoxy, mold compound, or any other material, or left empty.

Figure 7A:
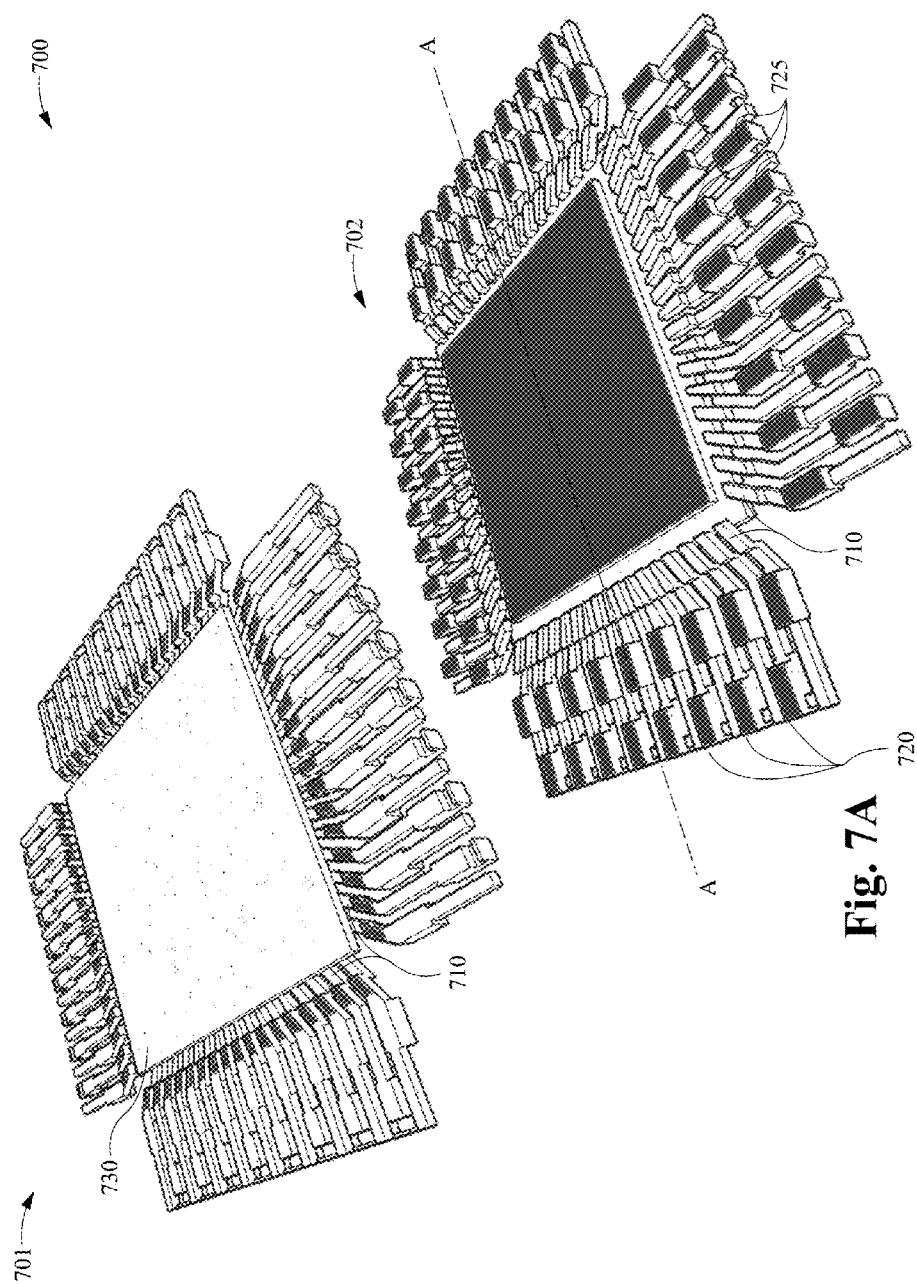
FIG. 7A shows a leadframe shown from a top view and a bottom view according to some embodiments.

FIG. 7A shows yet another embodiment of a leadframe 700 having auxiliary support structures shown from a top view 701 and a bottom view 702. Similarly to FIGS. 5A and 6A, the plated areas comprise the bottommost surface of the contact pads 725 and the die attach pad 730 (shown in grey). In the example of FIG. 7A, each contact lead 720 comprises its own auxiliary support structure 710. Each auxiliary support structure 710 is integrally formed between each individual contact lead 720 and the die attach pad 730.

Figure 7B:
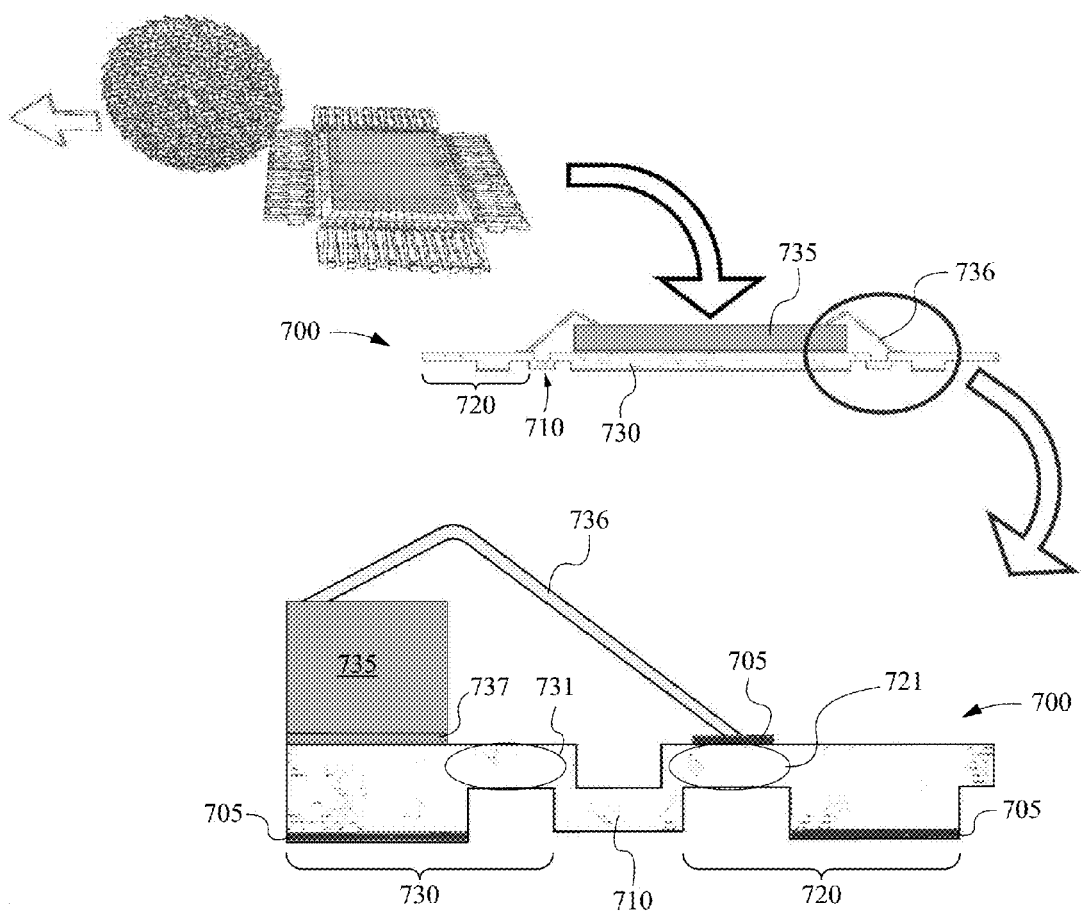
FIG. 7B shows a cross sectional of the leadframe in FIG. 7A along the line A according to some embodiments.

FIG. 7B shows the leadframe 700 in FIG. 7A in cross section along the line A, and having a semiconductor die 735 mounted on the die attach pad 730 and electrically coupled to the several contact leads 720 by wirebonds 736. In the close up view, the die 735 is shown mounted to the die attach pad 730 by an adhesive or tape 737. The wirebonds 736 are mounted to the contact lead 720 on a plated area 705 above a first support protrusion 721. The auxiliary support structures 710 are formed between the first support protrusion 721 and a second support protrusion 731 on the die attach pad 730. In cross section, the leadframe 700 is similar to the leadframe 500 of FIG. 5A, shown in cross section in FIG. 5C. However, the support structures 710 are contiguous through the die attach pad 730 to each contact lead 720, and are not contiguous with each other. When the auxiliary support structures 710 are removed in a later processing step, the die attach pad 730 is electrically isolated from the several contact leads 720, in addition to already being electrically isolated from each other. Advantageously, the wirebond 736 is mounted on the first support protrusion 721 while the auxiliary support structures 710 are still in place so that the first support protrusion 721 is not bent by the force of the applicator applying the wirebond 736 to thereon. The plated areas 705 on the bottom surface 709 of the leadframe 700 corresponding to the die attach pad 730 and the contact pads 725 are exposed after the leadframe is encased in a mold compound in a later processing step. The auxiliary support structures 710 are not. When the molded leadframe 700 is exposed to an etching process, the plated areas 705 will not be affected by the etching process and the auxiliary support structures 710 will be removed.

Figure 7C:
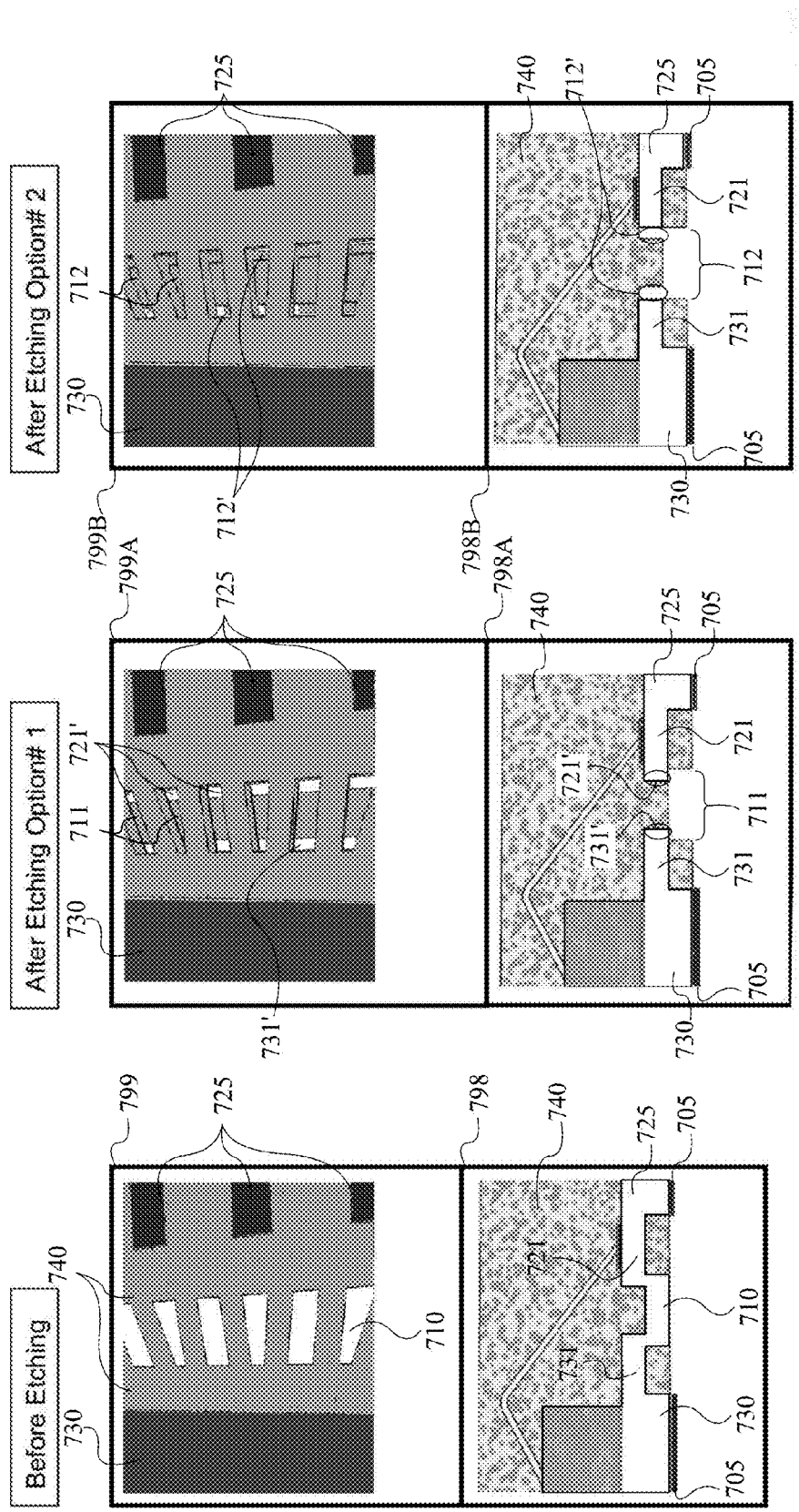
FIG. 7C shows optional results of the etching process of FIG. 5B according to some embodiments.

FIG. 7C shows optional results of the etching process of FIG. 5B with the leadframe 700. The before etching view on the left side of FIG. 7C shows a zoomed in view 799 and a cross section view 798 of the matrix 550 of FIG. 5C before an etching process. The die attach pad 730 and contact pads 725 are plated 705, but the auxiliary support structure 710 is not plated and the mold 740 is in between. FIG. 7D presents two exemplary etching options. The first etching option #1 is a partial thickness etching, removing only the auxiliary support structures 710, as shown in the middle zoomed in view 799A and the middle cross sectional view 798A. Rather than the grooves of the embodiments of FIGS. 5D and 6C, the removal of the auxiliary support structures 710 form voids 711. Each void 711 formed upon removal of the auxiliary support structures 710 is able to have a rectangular cross section. The voids 711 can have a rhomboid or rectangular shape from a bottom view. A bottom surface of the tip 721' of the first support protrusion 721 is exposed by the voids 711. The voids 711 can be filled with an epoxy, mold compound, or any other material. The second etching option #2 is a full thickness etching, removing the auxiliary support structures 710 and the tips 721' and 731', as shown in the right zoomed view 799B and the right cross sectional view 798B. In this example, voids 712 are formed by the removal of the auxiliary support structures 710. Additionally, two extra voided areas 712' are formed for each void 712. The tip 721' of the first support protrusion 721 along with the tip 731' of the second support protrusion 731 are etched away to form the additional voided areas 712'. Stated differently, the entire thickness of the leadframe 700 is etched through. The voided areas 712 and 712' can be filled with an epoxy, mold compound, or any other material, or left empty.

Figure 8A:
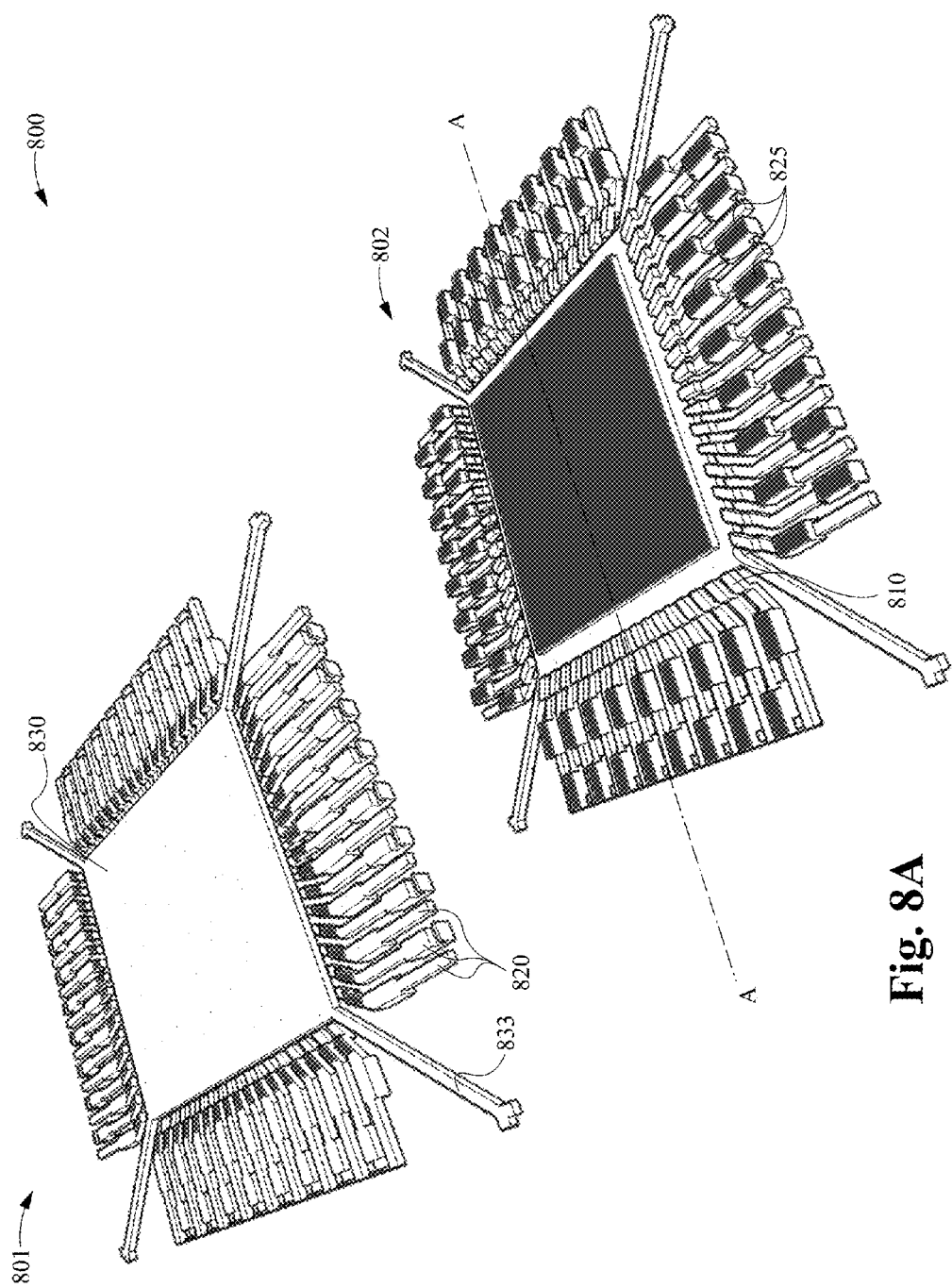
FIG. 8A shows a leadframe shown from a top view and a bottom view according to some embodiments.

FIG. 8A shows yet another embodiment of a leadframe 800 having auxiliary support structures shown from a top view 801 and a bottom view 802. Similarly to FIGS. 5A, 6A and 7A, the plated areas comprise the bottommost surface of the contact pads 825 and the die attach pad 830 (shown in grey). In the example of FIG. 8A, a each contact lead 820 comprises its own auxiliary support structure 810. Each auxiliary support structure 810 is integrally formed with each individual contact lead 820 and does not contact the die attach pad 830. Further, the die attach pad 830 comprises one or more supporting legs 833 for preventing the leadframe 800 from bending or breaking especially along the auxiliary support structures 810.

Figure 8B:
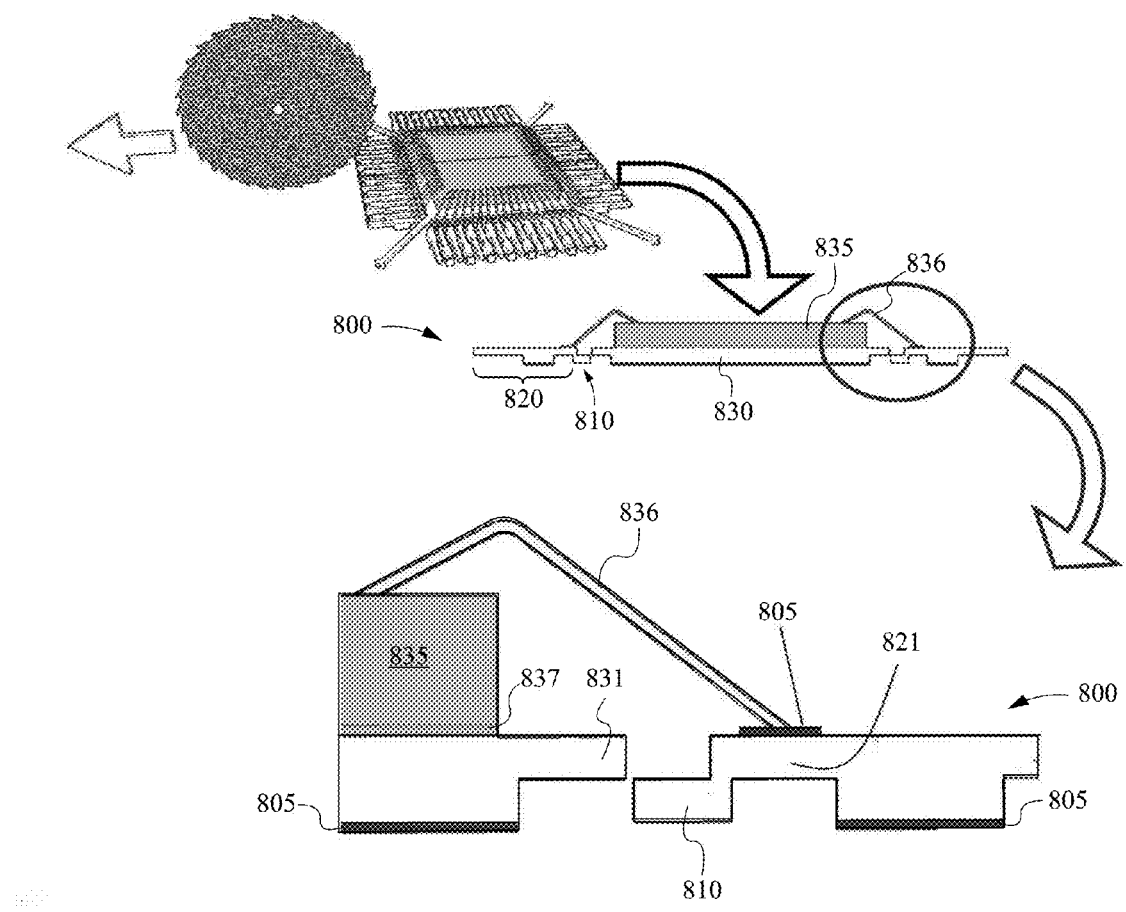
FIG. 8B shows a cross sectional of the leadframe in FIG. 8A along the line A according to some embodiments.

FIG. 8B shows the leadframe 800 in FIG. 8A in cross section along the line A, and having a semiconductor die 835 mounted on the die attach pad 830 and electrically coupled to the several contact leads 820 by wirebonds 836. In the close up view, the die 835 is shown mounted to the die attach pad 830 by an adhesive or tape 837. The wirebonds 836 are mounted to the contact lead 820 on a plated area 805 above a first support protrusion 821. The auxiliary support structures 810 are formed integrally with first support protrusion 821 and near a second support protrusion 831 on the die attach pad 830. In cross section, the leadframe 800 is similar to the leadframe 600 of FIG. 6A, shown in cross section in FIG. 6B. However, the support structures 810 are contiguous with each contact lead 820, and are not contiguous with each other or the die attach pad 830. When the auxiliary support structures 810 are removed in a later processing step, the die attach pad 830 is electrically isolated from the several contact leads 820, in addition to already being electrically isolated from each other. Advantageously, the wirebond 836 is mounted on the first support protrusion 821 while the auxiliary support structures 810 is still in place so that the first support protrusion 821 is not bent by the force of the applicator applying the wirebond 836 to thereon. The plated areas 805 on the bottom surface of the leadframe 800 corresponding to the die attach pad 830 and the contact pads 825 are exposed after the leadframe is encased in a mold compound in a later processing step. The auxiliary support structures 810 is not. When the molded leadframe 800 is exposed to an etching process, the plated areas 805 will not be affected by the etching process and the auxiliary support structures 810 will be removed.

Figure 8C:
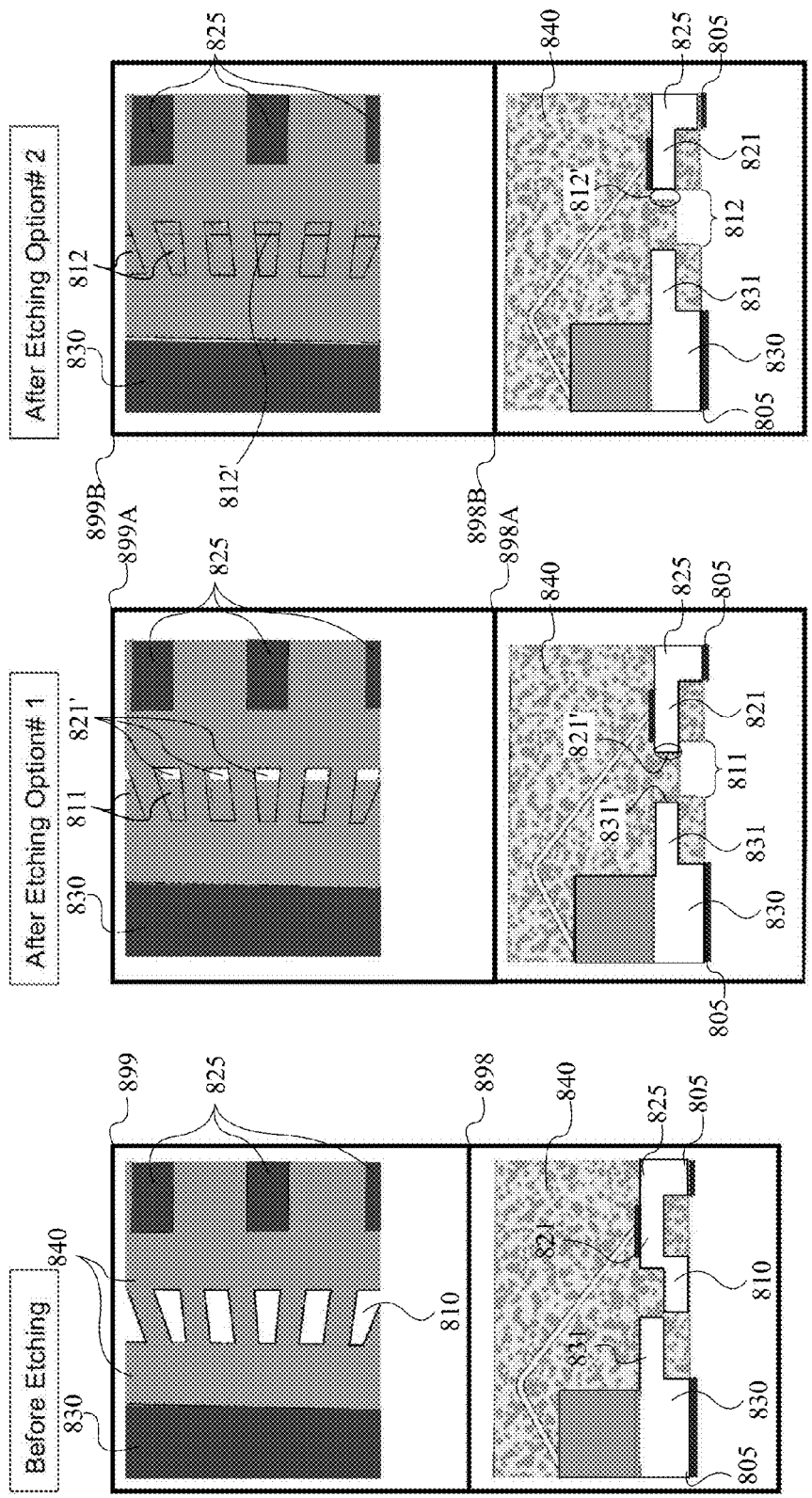
FIG. 8C shows optional results of the etching process of FIG. 5B according to some embodiments.

FIG. 8C shows optional results of the etching process of FIG. 5B with the leadframe 800. The before etching view on the left side of FIG. 8C shows a zoomed in view 899 and a cross section view 898 of the matrix 550 of FIG. 5C before an etching process. The die attach pad 830 and contact pads 825 are plated 805, but the auxiliary support structure 810 is not plated and the mold 840 is in between. FIG. 8D presents two exemplary etching options. The first etching option #1 is a partial thickness etching, removing only the auxiliary support structures 810, as shown in the middle zoomed in view 899A and the middle cross section view 898A. Rather than the grooves of the embodiments of FIGS. 5D and 6C, the removal of the auxiliary support structures 810 form voids 811, similar to the voids 711 of FIG. 7C. Each void 811 formed upon removal of the auxiliary support structures 810 is able to have a rectangular cross section. The voids 811 can have a rhomboid or rectangular shape from a bottom view. A bottom surface of the tip 821' of the first support protrusion 821 is exposed by each of the voids 811. Similarly, a bottom surface of the tip 831' of the second support protrusion 831 is also exposed by each of the voids 811. The voids 811 can be filled with an epoxy, mold compound, or any other material. The second etching option #2 is a full thickness etching, removing the auxiliary support structures 810 and the tip 821', as shown in the right zoomed in view 899B and the right cross section view 898B. In this example, the voids 812 are formed by the removal of the auxiliary support structures 810. The voids 812 each have an additional voided area 812'. The tip 821' of the first support protrusion 821 is etched away to form the additional voided area 812'. Stated differently, the entire thickness of the leadframe 800 is etched through. The voids 812 and 812' can be filled with an epoxy, mold compound, or any other material, or left empty.

The present invention has been described in terms of specific embodiments incorporating details to facilitate the understanding of the principles of construction and operation of the invention. The specific configurations shown and the methodologies described in relation to the various modules and the interconnections therebetween are for exemplary purposes only. By way of example, partial thickness portions are referenced herein. However, the person of ordinary skill having the benefit of this disclosure will readily appreciate that the thickness of any structure or member discussed herein need not be precisely partial the thickness of an original monolithic metal substrate from which the leadframe has been etched. Rather, the partial etched portions can be generalized as partially etched portions. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A semiconductor package comprising:
a leadframe including a die attach pad and having an uppermost leadframe surface and a lowermost leadframe surface;
at least one semiconductor die coupled with the die attach pad;
a set of contact leads of the leadframe having an uppermost contact leads surface and a lowermost contact leads surface and extending outwards from the die attach pad, each contact lead of the set of contact leads having a proximal end to the die attach pad and a distal end; and
at least one auxiliary support structure of the leadframe having a first support end, a second support end that is opposite to the first support end, an interior support surface and an exterior support surface that is parallel to the interior support surface and is flush with a bottom surface of the semiconductor package, wherein a portion of the interior support surface at the second support end is in contact with the proximal end of the set of contact leads between planes aligned with the uppermost leadframe surface and the lowermost leadframe surface and between planes aligned with the uppermost contact leads surface and the lowermost contact leads surface such that the first support end extends beyond the proximal end towards the at least one semiconductor die.

2. The semiconductor package of claim 1, wherein the at least one auxiliary support structure is integrally formed with the die attach pad and the proximal end of the set of contact leads.

3. The semiconductor package of claim 1, wherein the at least one auxiliary support structure is integrally formed with the die attach pad and the proximal end and at least one of the contact leads in the set of contact leads.

4. The semiconductor package of claim 1, wherein the at least one auxiliary support structure is integrally formed with the proximal end of the set of contact leads.

5. The semiconductor package of claim 1, wherein the at least one auxiliary support structure is integrally formed with the proximal end and at least one of the contact leads in the set of contact leads.

6. The semiconductor package of claim 1, wherein each contact lead comprises a full thickness portion at the distal end, the full thickness portion having an exposed contact pad.

7. The semiconductor package of claim 1, wherein each contact lead comprises a contact pad on a bottom surface of the distal end.

8. The semiconductor package of claim 7, wherein each of the contact pads is coated with an etching resistant material.

9. The semiconductor package of claim 1, wherein an exposed surface of the die attach pad is coated with an etching resistant material.

10. The semiconductor package of claim 1, wherein an exposed surface of the at least one auxiliary support structure is not coated with an etching resistant material.

11. The semiconductor package of claim 1, wherein the bottom surface of the semiconductor package is planar.

12. The semiconductor package of claim 7, wherein the bottom surface of the die attach pad and bottom surfaces of the contact pads define a planar bottom surface of the package.

13. A method of fabricating a semiconductor package comprising:
etching a through pattern in a metal thereby forming a die attach pad, a set of contact leads having a first set of contact pads surrounding the die attach pad and at least one auxiliary support member positioned between the die attach pad and the set of contact leads, wherein the die attach pad has an uppermost attach pad surface and a lowermost attach pad surface, the set of contact leads have an uppermost contact leads surface and a lowermost contact leads surface, and the at least one auxiliary support member includes a first support end, a second support end that is opposite to the first support end, an interior support surface and an exterior support surface that is parallel to the interior support surface, wherein a portion of the interior support surface at the second support end is in contact with the proximal end of the set of contact leads between planes aligned with the uppermost attach pad surface and the lowermost attach pad surface and between planes aligned with the uppermost contact leads surface and the lowermost contact leads surface such that the first support end extends beyond the proximal end towards the at least one semiconductor die;
mounting at least one semiconductor die on the die attach pad;
mounting bond wires for electrically coupling the at least one semiconductor die to at least one contact pad;
at least partially encasing the semiconductor die, bond wires and contact pads in a mold compound while leaving one surface of the metal substrate exposed; and
etching away at least a portion of the auxiliary support member thereby forming a void.

14. The method of claim 13, wherein the at least one auxiliary support structure is integrally formed with the die attach pad and the proximal end of the set of contact leads.

15. The method of claim 13, wherein the at least one auxiliary support structure is integrally formed with the die attach pad and the proximal end and at least one of the contact leads in the set of contact leads.

16. The method of claim 13, wherein the at least one auxiliary support structure is integrally formed with the proximal end of the set of contact leads.

17. The method of claim 13, wherein the at least one auxiliary support structure is integrally formed with the proximal end and at least one of the contact leads in the set of contact leads.

18. The method of claim 13, wherein forming a set of contact leads comprises forming a full thickness portion at the distal end.

19. The method of claim 13, further comprising filling the voids with an epoxy.

20. The method of claim 19, wherein filling the voids with epoxy comprises a stencil step.

21. The method of claim 19, wherein filling a voids with epoxy comprises a nozzle filling step.

22. The method of claim of claim 13, further comprising, after etching away at least a portion of the auxiliary support member, etching away at least a portion of the die attach pad and at least a portion of the set of contact leads.

* * * * *